(12) United States Patent
Harada et al.

(10) Patent No.: US 7,034,404 B1
(45) Date of Patent: Apr. 25, 2006

(54) RESIN COMPOSITION FOR SEMICONDUCTOR ENCAPSULATION, SEMICONDUCTOR DEVICE OBTAINED WITH THE SAME, AND PROCESS FOR PRODUCING SEMICONDUCTOR DEVICE

(75) Inventors: Tadaaki Harada, Osaka (JP); Hideaki Taki, Osaka (JP); Toshitsugu Hosokawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/914,363

(22) PCT Filed: Feb. 21, 2000

(86) PCT No.: PCT/JP00/00951

§ 371 (c)(1),
(2), (4) Date: Aug. 27, 2001

(87) PCT Pub. No.: WO00/50512

PCT Pub. Date: Aug. 31, 2000

(30) Foreign Application Priority Data

| Feb. 25, 1999 | (JP) | ................................. 11/048905 |
| Feb. 25, 1999 | (JP) | ................................. 11/048906 |
| Feb. 25, 1999 | (JP) | ................................. 11/048907 |
| Jul. 27, 1999 | (JP) | ................................. 11/212068 |
| Jul. 27, 1999 | (JP) | ................................. 11/212069 |
| Jul. 27, 1999 | (JP) | ................................. 11/212070 |
| Aug. 26, 1999 | (JP) | ................................. 11/240511 |

(51) Int. Cl.
*H01L 23/29* (2006.01)

(52) U.S. Cl. ...................................................... 257/788
(58) Field of Classification Search ......... 257/787–796
See application file for complete search history.

(56) References Cited

U.S. PATENT DOCUMENTS

| 5,565,709 A | 10/1996 | Fukushima et al. |
| 5,585,421 A | 12/1996 | Kawano et al. ............. 523/466 |
| 5,731,370 A * | 3/1998 | Shiobara et al. ............ 523/466 |

FOREIGN PATENT DOCUMENTS

| EP | 0 590 975 A1 | 4/1994 |
| EP | 0 829 455 A2 | 3/1998 |
| EP | 1 004 630 A1 | 5/2000 |
| JP | 2-147618 | 6/1990 |
| JP | 2-147618 A | 6/1990 |
| JP | 10-125834 | 5/1998 |
| JP | 10168161 A * | 6/1998 |
| JP | 10-189832 | 7/1998 |
| JP | 10-189832 A | 7/1998 |
| JP | 11-17075 | 1/1999 |
| JP | 11-40591 | 2/1999 |

* cited by examiner

*Primary Examiner*—Leonardo Andújar
(74) *Attorney, Agent, or Firm*—Sughrue Mion, PLLC

(57) ABSTRACT

The present invention provides a resin composition for semiconductor encapsulation excellent in reliability in humidity resistance and storage stability as well as in dischargeability and coatability. The resin composition for semiconductor encapsulation comprises: (A) an epoxy resin; (B) a phenolic resin; (C) a latent curing accelerator; and D) an inorganic filler, and has a viscosity of 7,000 poise or more at 25° C. and 5,000 poise or less at 80° C.

21 Claims, No Drawings

RESIN COMPOSITION FOR SEMICONDUCTOR ENCAPSULATION, SEMICONDUCTOR DEVICE OBTAINED WITH THE SAME, AND PROCESS FOR PRODUCING SEMICONDUCTOR DEVICE

TECHNICAL FIELD

The present invention relates to an epoxy resin-based composition for semiconductor encapsulation which exhibits a low viscosity at a temperature as relatively low as 80° C. or lower and is excellent particularly in dischargeability and coatability as well as storage stability, a semiconductor device prepared by using the epoxy resin-based composition and a process for the production of the semiconductor device.

BACKGROUND ART

In order to encapsulate semiconductors at TAP (Tape Automated Bonding) process, COB (Chip On Board) process, etc., a liquid encapsulating medium has heretofore been used. Such a liquid encapsulating medium is used at room temperature (25° C.). By means of a dispenser or through printing process, semiconductor elements are encapsulated with such a resinous medium to produce semiconductor devices. As such a liquid encapsulating medium there has been generally known an epoxy resin composition comprising a liquid epoxy resin, an acid anhydride-based curing agent, an ordinary curing accelerator and a silica powder.

The foregoing liquid encapsulating medium comprises an acid anhydride-based curing agent as a curing agent and thus can be easily liquefied and fairly discharged and applied. However, the foregoing liquid encapsulating medium is disadvantageous in that it exhibits a high hygroscopicity under high humidity conditions and thus shows a deteriorated reliability in humidity resistance. Further, the foregoing liquid encapsulating medium normally stays liquid and thus exhibits a poor storage stability. Accordingly, the foregoing liquid encapsulating medium shows a drastic rise in viscosity or liable to sedimentation of silica powder during storage at room temperature and thus needs to be frozen to solid or otherwise stored in a special manner.

It is therefore an object of the present invention to provide a resin composition for semiconductor encapsulation excellent in reliability in humidity resistance and storage stability as well as in dischargeability and coatability, a semiconductor device encapsulated with the resin composition for semiconductor encapsulation and a process for the production of the semiconductor device.

DISCLOSURE OF THE INVENTION

The foregoing object of the invention is accomplished with the first essence of the invention which lies in a resin composition for semiconductor encapsulation comprising the following components (A) to (D) and having a viscosity of 7,000 poise or more at 25° C. and 5,000 poise or less at 80° C.:

(A) an epoxy resin;
(B) a phenolic resin;
(C) a latent curing accelerator; and
(D) an inorganic filler.

The second essence of the invention lies in a semiconductor device comprising a semiconductor element provided on a wiring circuit board with a plurality of connecting electrode portions interposed therebetween, the gap between the wiring circuit board and the semiconductor element being sealed with an encapsulating resin layer, wherein the encapsulating resin layer is formed by the foregoing resin composition for semiconductor encapsulation.

The third essence of the invention lies in a process for the production of a semiconductor device comprising a semiconductor element provided on a wiring circuit board with a plurality of connecting electrode portions interposed therebetween, the gap between the wiring circuit board and the semiconductor element being sealed with an encapsulating resin layer, which comprises filling the gap between the wiring circuit board and the semiconductor element with the foregoing resin composition for semiconductor encapsulation, and then curing the resin composition to form the encapsulating resin layer.

The fourth essence of the invention lies in a semiconductor device comprising a semiconductor element provided on a wiring circuit board, the wiring circuit board and the semiconductor element being electrically connected to each other, the semiconductor element being encapsulated by an encapsulating resin layer in such an arrangement that the semiconductor element is incorporated therein, wherein the encapsulating resin layer is formed by the foregoing resin composition for semiconductor encapsulation.

The fifth essence of the invention lies in a process for the production of a semiconductor device comprising a semiconductor element provided on a wiring circuit board, the wiring circuit board and the semiconductor element being electrically connected to each other, the semiconductor element being encapsulated by an encapsulating resin layer in such an arrangement that the semiconductor element is incorporated therein, which comprises placing a semiconductor element on the wiring circuit board, electrically connecting the wiring circuit board and the semiconductor element to each other, supplying the foregoing resin composition for semiconductor encapsulation onto the wiring circuit board on the semiconductor element side thereof, and then curing the resin composition for semiconductor encapsulation to form the encapsulating resin layer.

The sixth essence of the invention lies in a semiconductor product comprising a semiconductor device having a resin encapsulation layer formed with a plurality of connecting electrode portions interposed therebetween, the semiconductor device being provided on a mounting board with the wiring circuit board of the semiconductor device being opposed to the mounting board and the gap between the mounting board and the semiconductor device being sealed with an encapsulating resin layer, wherein the encapsulating resin layer is formed by the foregoing resin composition for semiconductor encapsulation.

The seventh essence of the invention lies in a process for the production of a semiconductor device, which comprises a step of forming a resin layer made of the foregoing resin composition for semiconductor encapsulation on the protruding electrode portion side of a semiconductor wafer having a plurality of semiconductor elements with protruding electrode portions formed thereon to a predetermined thickness in such an arrangement that at least the forward end of the protruding electrode portions is exposed to the exterior of the resin layer, and a step of cutting the semiconductor wafer having a resin layer formed thereon to individual semiconductor elements.

The eighth essence of the invention lies in a process for the production of a semiconductor device, which comprises a step of supplying the resin composition for semiconductor encapsulation onto the whole of a plurality of semiconductor elements provided on a matrix wiring circuit board having individual circuits formed thereon to form a resin layer with the semiconductor elements being incorporated therein, and a step of cutting the matrix wiring circuit board having a resin layer formed thereon with the semiconductor elements being incorporated therein together with the resin layer to every semiconductor element.

The ninth essence of the invention lies in a process for the production of a semiconductor device, which comprises a step of forming a resin layer made of the foregoing resin composition for semiconductor encapsulation on the protruding electrode portion side of a semiconductor wafer having a plurality of semiconductor elements with protruding electrode portions formed thereon to a predetermined thickness, a step of cutting the semiconductor wafer having a resin layer formed thereon to individual semiconductor elements, and a step of contact-bonding a wiring circuit board and the semiconductor element thus cut under heating with the resin layer side of the semiconductor element and the wiring circuit board being opposed to each other so that the two components are electrically connected to each other and the resin layer is melted and cured to form an encapsulating resin layer between the semiconductor element and the wiring circuit board, thereby encapsulating the semiconductor element.

The tenth essence of the invention lies in a process for the production of a semiconductor device, which comprises a step of applying the foregoing resin composition for semiconductor encapsulation to a matrix wiring circuit board having individual circuits formed thereon to form a resin layer thereon, a step of cutting the wiring circuit board having a resin layer formed thereon to individual wiring circuit boards, and a step of contact-bonding semiconductor elements each having a plurality of connecting electrode portions provided thereon and the wiring circuit boards thus cut with the connecting electrode portion side of the semiconductor elements and the wiring circuit boards being opposed to each other so that the two components are electrically connected to each other and the resin layer is melted and cured to form an encapsulating resin layer between the semiconductor elements and the wiring circuit boards, thereby encapsulating the semiconductor elements.

The inventors made extensive studies of an encapsulating material excellent in reliability in humidity resistance and storage stability as well as in discharge ability and coatability. As a result, it was found that the desired object of the invention can be accomplished by the use of a resin composition comprising an epoxy resin, a phenolic resin, a latent curing accelerator and an inorganic filler and having a predetermined viscosity at each of temperatures of 25° C. and 80° C. Thus, the present invention has been worked out.

A resin composition for semiconductor encapsulation comprising as the latent curing accelerator a microcapsule type curing accelerator having a core-shell structure in which a core portion made of the curing accelerator is covered by a specific shell portion is advantageous in that it exhibits an extremely prolonged pot life and thus is particularly excellent in storage stability.

Further, a resin composition for semiconductor encapsulation comprising as the inorganic filler a spherical fused silica powder incorporated therein in a specific proportion is advantageous in that it exhibits an excellent fluidity and thus is particularly excellent in dischargeability and coatability.

BEST MODE FOR CARRYING OUT THE INVENTION

Embodiments of implication of the present invention will be described hereinafter in detail.

The resin composition for semiconductor encapsulation of the invention comprises an epoxy resin (component A), a phenolic resin (component B), a latent curing accelerator (component C) and an inorganic filler (component D) and exhibits a specific viscosity at each temperature of 25° C. and 80° C.

The resin composition for semiconductor encapsulation of the invention is roughly divided into three embodiments by the properties of the epoxy resin (component A) and phenolic resin (component B) which are essential components thereof. The first embodiment of the resin composition for semiconductor encapsulation of the invention comprises a liquid epoxy resin (A1) as the epoxy resin (component A) and a solid phenolic resin (B1) as the phenolic resin (component B). The second embodiment of the resin composition for semiconductor encapsulation of the invention comprises a solid epoxy resin (A2) as the epoxy resin (component A) and a liquid phenolic resin (B2) as the phenolic resin (component B). The third embodiment of the resin composition for semiconductor encapsulation of the invention comprises a solid epoxy resin (A3) as the epoxy resin (component A) and a solid phenolic resin (B3) as the phenolic resin (component B). As the remaining components, i.e., latent curing accelerator (component C), inorganic filler (component D) and other additives there are used those common to the three embodiments.

The first embodiment of the resin composition for semiconductor encapsulation, which comprises a liquid epoxy resin (A1) as the epoxy resin (component A) and a solid phenolic resin (B1) as the phenolic resin (component B), will be further described hereinafter.

The liquid epoxy resin (A1) is not specifically limited so far as it stays liquid at a temperature of 25° C. Various epoxy resins may be used. Examples of these epoxy resins employable herein include bisphenol F type epoxy resin, bisphenol A type epoxy resin, alicyclic epoxy resin, and allylated bisphenol type epoxy resin. These epoxy resins may be used singly or in combination of two or more thereof. The term "liquid epoxy resin (component A1)" as used herein is meant to indicate not only an epoxy resin which stays liquid at 25° C. when it is used singly but also an epoxy resin component which is composed of two or more of the epoxy resins and stays liquid at 25° C.

The foregoing liquid epoxy resin to be used herein preferably exhibits an epoxy equivalent of from 110 to 220 g/eq, particularly from 140 to 200 g/eq.

The foregoing solid phenolic resin (component B1) is not specifically limited so far as it acts as a curing agent for the foregoing liquid epoxy resin (component A1) and stays solid at a temperature of 25° C. Various phenolic resins may be used. These phenolic resins may be used in combination with acid anhydride-based curing agents such as tetrahydrophthalic anhydride, hexahydrophthalic anhydride, methylhexahydrophthalic anhydride and phthalic anhydride, amines, phthalic acids, etc. so far as the desired object of the invention cannot be impaired. Examples of the solid phenolic resin (component B1) employable herein include polyfunctional solid phenolic resin, bisphenolic resin, naphthalene type phenolic resin, phenol novolak resin, and triphenylmethane type phenolic resin. These solid phenolic resins may be used singly or in combination of two or more thereof. The term "polyfunctional solid phenolic resin" as used herein is meant to indicate a solid phenolic resin having at least one aromatic ring containing two or more phenolic hydroxyl groups wherein the number of phenolic hydroxyl groups per molecule is 3 or more and there is contained two or more aromatic rings per molecule. Examples of the polyfunctional solid phenolic resin employable herein include trifunctional solid phenolic resin, tetra functional solid phenolic resin, and pentafunctional solid phenolic resin. The polyfunctional solid phenolic resin, if used, preferably has a number-average molecular weight of 450 or less. The term "solid phenolic resin (component B1)" as used herein is meant to indicate not only a phenolic resin which stays solid at 25° C. when it is used singly but also a phenolic resin component which is composed of two or more of the phenolic resins and stays solid at 25° C.

Among the foregoing solid phenolic resins (component B1), the trifunctional solid phenolic resin may be in the form of phenolic resin having a structure represented by the following general formula (2) or (3):

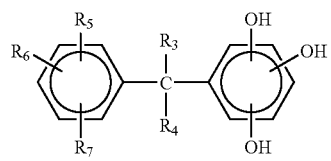
(2)

wherein $R_3$ to $R_7$ may be the same or different and each represent a hydrogen atom or methyl group.

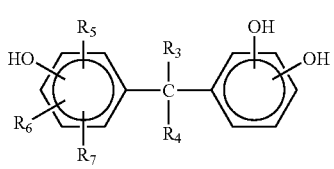
(3)

wherein $R_3$ to $R_7$ are as defined in the general formula (2).

Among the foregoing solid phenolic resins (component B1) the tetrafunctional solid phenolic resin can be in the form of phenolic resin having a structure represented by the following general formula (4) or (5):

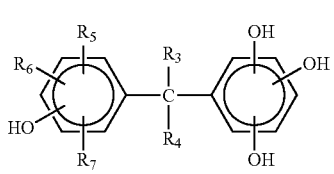
(4)

wherein $R_3$ to $R_7$ are as defined in the general formula (2).

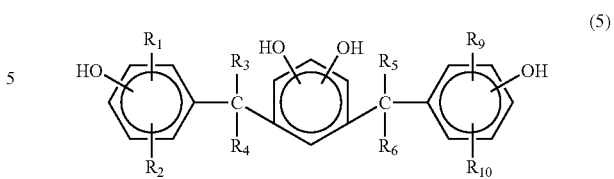
(5)

wherein $R_3$ to $R_{10}$ may be the same or different and each represent a hydrogen atom or methyl group.

Among the foregoing solid phenolic resins (component B1), the pentafunctional solid phenolic resin can be in the form of phenolic resin having a structure represented by the following general formula (6):

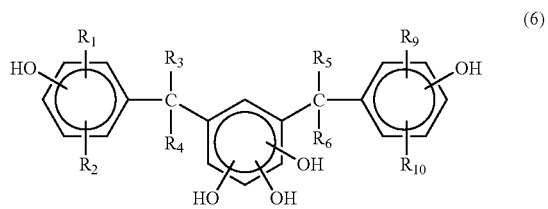
(6)

wherein $R_3$ to $R_{10}$ are as defined in the general formula (5).

The foregoing solid phenolic resin to be used herein preferably has a hydroxyl equivalent of from 30 to 260 g/eq and a softening point of from 40° C. to 100° C. or a melting point of from 50° C. to 210° C., particularly a hydroxyl equivalent of from 50 to 110 g/eq and a softening point of from 60° C. to 90° C. or a melting point of from 70° C. to 190° C. The softening point can be measured according to JIS K 7243.

The mixing proportion of the foregoing liquid epoxy resin (component A1) and solid phenolic resin (component B1) is preferably predetermined such that the amount of hydroxyl group in the phenolic resin per equivalent of epoxy group in the foregoing epoxy resin is from 0.6 to 1.4 equivalents, more preferably from 0.7 to 1.1 equivalents.

In the first embodiment, the foregoing liquid epoxy resin (component A1) and solid phenolic resin (component B1) to be combined are preferably a bisphenol F type epoxy resin and a polyfunctional solid phenolic resin from the standpoint of fluidity, heat resistance and curability.

The second embodiment of the resin composition for semiconductor encapsulation, which comprises a solid epoxy resin (A2) as the epoxy resin (component A) and a liquid phenolic resin (B2) as the phenolic resin (component B), will be further described hereinafter.

The foregoing solid epoxy resin (component A2) is not specifically limited so far as it stays solid at a temperature of 25° C. Various epoxy resins may be used. Examples of the epoxy resins employable herein include polyfunctional solid epoxy resin, crystalline epoxy resin, bifunctional solid epoxy resin, and triglycidyl isocyanurate. These solid epoxy resins may be used singly or in combination of two or more thereof. The term "polyfunctional solid epoxy resin" as used herein is meant to indicate a solid epoxy resin having three or more epoxy groups per molecule. Examples of the poly functional solid epoxy resin employable herein include tetrafunctional naphthalene type epoxy resin, and triphenylmethane type epoxy resin. The term "crystalline epoxy resin" as used herein is meant to indicate a solid epoxy resin which shows many crystalline peaks when subjected to X-ray diffractometry, physically shows a sharp melting point and exhibits a drastically lowered viscosity during melting because there is little or no intermolecular mutual interaction. Examples of the crystalline epoxy resin employable herein include bisphenol type epoxy resin, biphenyl type epoxy resin, and stilbene type epoxy resin. The term "solid epoxy resin (component A2)" as used herein is meant to indicate not only an epoxy resin which stays solid at 25° C. when it is used singly but also an epoxy resin component which is composed of two or more of the epoxy resins and stays solid at 25° C.

Among the foregoing solid epoxy resins (component A2), the tetrafunctional naphthalene type epoxy resin may be, e.g., Type EXA-4701 epoxy resin commercially available from DAINIPPON INK & CHEMICALS, INC. Type EXA-4701 epoxy resin is represented by the following structural formula (7):

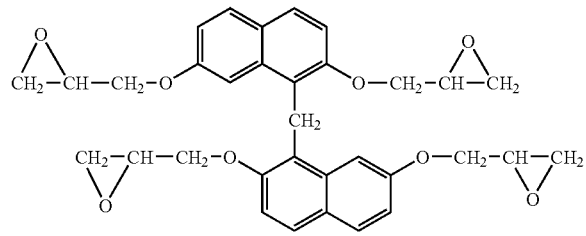
(7)

Among the foregoing solid epoxy resins (component A2), the triphenylmethane type epoxy resin may be, e.g., Type EPPN-501HY epoxy resin commercially available from NIPPON KAYAKU CO., LTD. Type EPPN-501HY epoxy resin is represented by the following chemical formula (8):

The liquid phenolic resin (component B2) to be used in combination with the foregoing solid epoxy resin (component A2) is not specifically limited so far as it acts as a curing agent for the foregoing solid epoxy resin (component A2) and stays liquid at a temperature of 25° C. Various phenolic resins can be used. Examples of the liquid phenolic resin employable herein include allylated phenol novolak, diallylated bisphenol A, acetylated phenol, and diallylbisphenol F. These liquid phenolic resins may be used singly or in combination of two or more thereof. The term "liquid phenolic resin (component B2)" as used herein is meant to indicate not only a phenolic resin which stays liquid at 25° C. when it is used singly but also a phenolic resin component which is composed of two or more of the phenolic resins and stays liquid at 25° C.

The foregoing liquid phenolic resin to be used herein preferably has a hydroxyl equivalent of from 80 to 200 g/eq, particularly from 100 to 170 g/eq.

The mixing proportion of the foregoing solid epoxy resin (component A2) and liquid phenolic resin (component B2) is preferably predetermined such that the amount of hydroxyl group in the phenolic resin per equivalent of epoxy group in the foregoing epoxy resin is from 0.7 to 1.4 equivalents, more preferably from 0.9 to 1.1 equivalents.

In the second embodiment, the foregoing solid epoxy resin (component A2) and liquid phenolic resin (component B2) to be combined are preferably a tetrafunctional naphthalene type epoxy resin and an allylated phenol novolak from the standpoint of heat resistance and fluidity.

The third embodiment of the resin composition for semiconductor encapsulation, which comprises a solid epoxy resin (component A3) as the epoxy resin (component A) and a solid phenolic resin (component B3) as the phenolic resin (component B), will be further described hereinafter.

The foregoing solid epoxy resin (component A3) is not specifically limited so far as it stays solid at a temperature of 25° C. Various epoxy resins can be used. Examples of the solid epoxy resin employable herein include polyfunctional solid epoxy resin, crystalline epoxy resin, bifunctional solid epoxy resin, triglycidyl isocyanurate, bisphenol F type

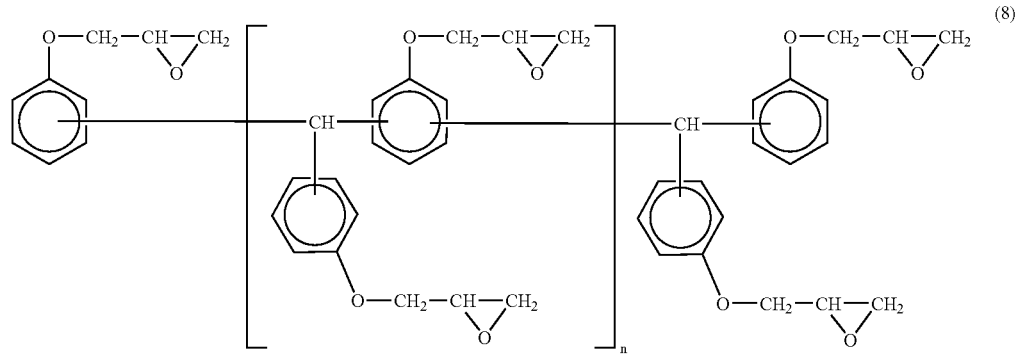
(8)

wherein n represents 0 or a positive integer.

The foregoing solid epoxy resin to be used herein preferably has an epoxy equivalent of from 140 to 250 g/eq and a softening point of from 50° C. to 100° C. or a melting point of from 45° C. to 150° C., particularly an epoxy equivalent of from 150 to 220 g/eq and a softening point of from 60° C. to 80° C. or a melting point of from 50° C. to 130° C.

epoxy resin, and bisphenol A type epoxy resin. These solid epoxy resins may be used singly or in combination of two or more thereof. The term "polyfunctional solid epoxy resin" as used herein is meant to indicate a solid epoxy resin having three or more epoxy groups per molecule. Examples of the polyfunctional solid epoxy resin employable herein include tetrafunctional naphthalene type epoxy resin, triphenylmethane type epoxy resin, dicyclopentadiene type epoxy resin, Techmore VG3101L (produced by MITSUI CHEMICAL CORPORATION), and orthocresol novolak type epoxy resin. The term "crystalline epoxy resin" as used herein is meant to indicate a solid epoxy resin which shows many crystalline peaks when subjected to X-ray diffractometry, physically shows a sharp melting point and exhibits a drastically lowered viscosity during melting because there is little or no intermolecular mutual interaction. Examples of the crystalline epoxy resin employable herein include bisphenol type epoxy resin, biphenyl type epoxy resin, and stilbene type epoxy resin. When those having a melting point of 90° C. or higher among these crystalline epoxy resins are used, two or more of these crystalline epoxy resins are preferably used for the reason that the resulting fluidity at a temperature of 80° C. or lower is improved. The term "solid epoxy resin (component A3)" as used herein is meant to indicate not only an epoxy resin which stays solid at 25° C. when it is used singly but also an epoxy resin component which is composed of two or more of the epoxy resins and stays solid at 25° C.

Among the foregoing solid epoxy resins (component A3), the crystalline epoxy resin may be, e.g., Type GK-4137 epoxy resin (commercially available from NIPPON STEEL CORP.), Type GK-5079 (commercially available from NIPPON STEEL CORP.), and Type YDC-1312 (commercially available from Tohto Kasei Corp.). Type GK-4137 epoxy resin is represented by the following chemical formula (9). Type GK-5079 epoxy resin is represented by the following chemical formula (10). Type YDC-1312 epoxy resin is represented by the following chemical formula (11).

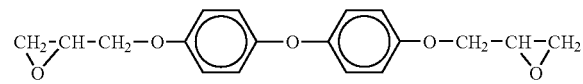

(9)

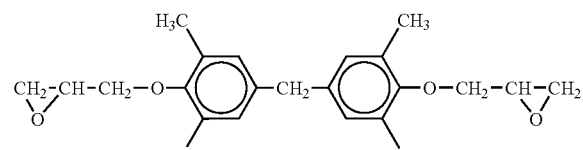

(10)

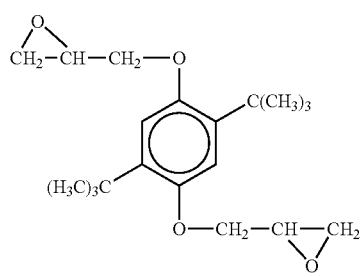

(11)

Among the foregoing crystalline epoxy resins, the biphenyl type epoxy resin is represented by the following general formula (12):

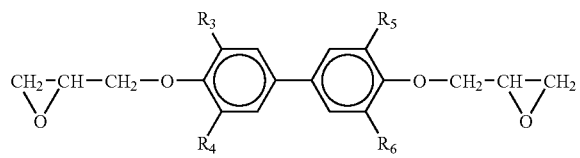

(12)

wherein $R_3$ to $R_6$ may be the same or different and each represent a hydrogen atom or $C_{1-5}$ alkyl group.

Examples of the $C_{1-5}$ alkyl group represented by $R_3$ to $R_6$ in the foregoing general formula (12) include straight-chain or branched lower alkyl group such as methyl group, ethyl group, n-propyl group, isopropyl group, n-butyl group, isobutyl group, sec-butyl group and tert-butyl group. $R_3$ to $R_6$ may be the same or different.

As the foregoing biphenyl type epoxy resin there can be used a mixture of a biphenyl type epoxy resin having a structure represented by the following general formula (13) wherein all $R_3$ to $R_6$ are methyl group and a biphenyl type epoxy resin having a structure represented by the following general formula (14) wherein all $R_3$ to $R_6$ are hydrogen atom in almost the same amount:

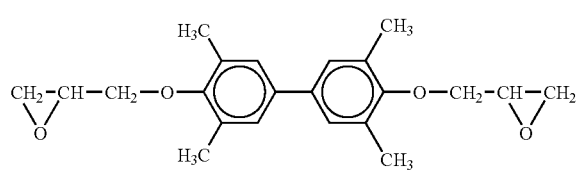

(13)

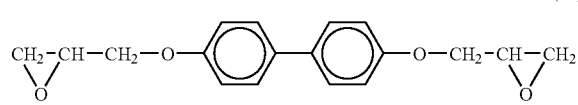

(14)

The foregoing solid epoxy resin to be used as component A3 preferably has an epoxy equivalent of from 140 to 270 g/eq and a softening point of from 50° C. to 100° C. or a melting point of from 40° C. to 150° C., particularly an epoxy equivalent of from 150 to 220 g/eq and a softening point of from 60° C. to 80° C. or a melting point of from 60° C. to 130° C.

The foregoing solid phenolic resin (component B3) to be used in combination with the solid epoxy resin (component A3) is not specifically limited so far as it stays solid at a temperature of 25° C. Various phenolic resins can be used. These phenolic resins may be used in combination with acid anhydride-based curing agents such as tetrahydrophthalic anhydride, hexahydrophthalic anhydride, methylhexahydrophthalic anhydride and phthalic anhydride, amines, phthalic acids, etc. so far as the desired object of the invention cannot be impaired. Examples of the solid phenolic resin (component B3) employable herein include polyfunctional solid phenolic resin, bisphenols, terpenephenols, terpenediphenols, dihydroxynaphthalenes, novolakphenol, allylated phenol, acetylated phenol, and triphenylmethane type phenolic resin. These solid phenolic resins may be used singly or in combination of two or more thereof. The term "polyfunctional solid phenolic resin" as used herein is meant to indicate a solid phenolic resin having at least one aromatic ring containing two or more phenolic hydroxyl groups wherein the number of phenolic hydroxyl groups per molecule is 3 or more and there is contained two or more aromatic rings per molecule. Examples of the polyfunctional solid phenolic resin employable herein include trifunctional solid phenolic resin, tetrafunctional solid phenolic resin, and pentafunctional solid phenolic resin. The polyfunctional solid phenolic resin, if used, preferably has a number-average molecular weight of 450 or less. The term "solid phenolic resin (component B3)" as used herein is meant to indicate not only a phenolic resin which stays solid at 25° C. when it is used singly but also a phenolic resin component which is composed of two or more of the phenolic resins and stays solid at 25° C.

Among the foregoing solid phenolic resins (component B3), the trifunctional solid phenolic resin may be, e.g., a phenolic resin having a structure represented by the following general formula (15) or (16):

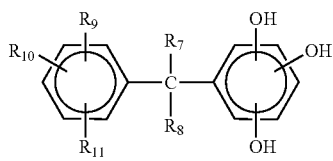

(15)

wherein $R_7$ to $R_{11}$ may be the same or different and each represent a hydrogen atom or methyl group.

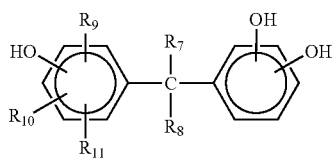

(16)

wherein $R_7$ to $R_{11}$ are as defined in the general formula (15).

Among the solid phenolic resins (component B3), the tetrafunctional solid phenolic resin can be, e.g., a phenolic resin having a structure represented by the following general formula (17) or (18):

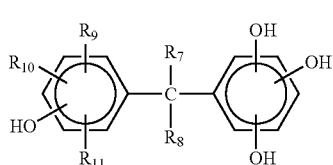

(17)

wherein $R_7$ to $R_{11}$ are as defined in the general formula (15).

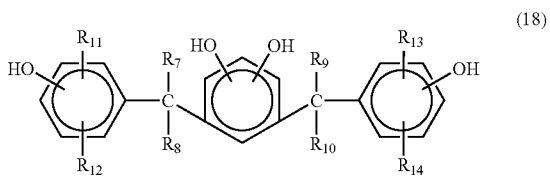

(18)

wherein $R_7$ to $R_{14}$ may be the same or different and each represent a hydrogen atom or methyl group.

Among the solid phenolic resins (component B3), the pentafunctional solid phenolic resin can be, e.g., a phenolic resin having a structure represented by the following general formula (19):

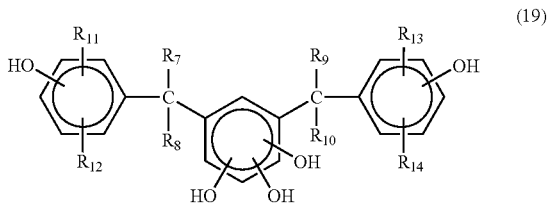

(19)

wherein $R_7$ to $R_{14}$ are as defined in the general formula (18).

The foregoing solid phenolic resin to be used as the component B3 preferably has a hydroxyl equivalent of from 30 to 260 g/eq and a softening point of from 40° C. to 100° C. or a melting point of from 50° C. to 210° C., particularly a hydroxyl equivalent of from 50 to 110 g/eq and a softening point of from 60° C. to 90° C. or a melting point of from 70° C. to 190° C. The mixing proportion of the foregoing solid epoxy resin (component A3) and solid phenolic resin (component B3) is preferably predetermined such that the amount of hydroxyl group in the phenolic resin per equivalent of epoxy group in the foregoing epoxy resin is from 0.6 to 1.4 equivalents, more preferably from 0.7 to 1.1 equivalents.

The foregoing solid epoxy resin (component A3) and solid phenolic resin (component B3) to be combined are preferably a crystalline epoxy resin [particularly Type GK-4137 (produced by NIPPON STEEL CORP.] and a polyfunctional solid phenolic resin or tetrafunctional naphthalene type epoxy resin or triphenylmethane type epoxy resin and a bifunctional bisphenol resin from the standpoint of curability, heat resistance and fluidity.

The resin composition for semiconductor encapsulation of the invention comprises a latent curing accelerator (component C) and an inorganic filler (component D) incorporated therein as essential components in combination with the various epoxy resins and phenolic resins according to the first to third embodiments.

When incorporated in the resin composition for semiconductor encapsulation, the foregoing latent curing accelerator (component C) acts to cause the resin composition to show a viscosity increase of 10 times or less after 72 hours of aging in a 50° C. atmosphere (viscosity measured at 80° C.). An example of the latent curing accelerator is a microcapsule type curing accelerator having a core-shell structure in which a core portion made of one or more selected from various curing accelerators is covered by a shell portion comprising as a main component a polymer having a structural unit represented by the following general formula (1) wherein the reactive amino group present in the shell portion is blocked. The resin composition for semiconductor encapsulation comprising such a microcapsule type curing accelerator incorporated therein exhibits extremely prolonged pot life and thus is excellent particularly in storage stability. Even when the use of an ordinary curing accelerator in a small amount causes the resin composition to show a viscosity increase of 10 times or less, normally 1 to 3 times, the curing accelerator is regarded as a latent curing accelerator.

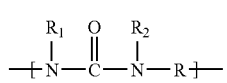

(1)

wherein R represents a divalent or trivalent organic group; and $R_1$ and $R_2$, which may be the same or different, each represent a hydrogen atom or monovalent organic group.

The curing accelerator to be encapsulated as a core portion in the foregoing microcapsule type curing accelerator is not specifically limited so far as it acts to accelerate curing reaction. Known curing accelerators can be used. Those which stay liquid at room temperature are suitable from the standpoint of workability in microencapsulation or the characteristics of the resulting mocrocapsules. The term "liquid at room temperature" as used herein is meant to indicate that the curing accelerator stays liquid at room temperature (25° C.) itself or the curing accelerator stays solid at room temperature but can be liquefied by dissolving or dispersing in an arbitrary organic solvent.

Examples of the curing accelerator to be encapsulated include amine-based curing accelerator, imidazole-based curing accelerator, phosphorus-based curing accelerator, and phosphorus-boron-based curing accelerator. Specific examples of these curing accelerators include alkyl-substituted guanidines such as ethylguanidine, trimethylguanidine, phenylguanine and diphenylguanidine, 3-substituted phenyl-1,1-dimethylureas such as 3-(3,4-dichlorophenyl)-1,1-dimethylurea, 3-phenyl-1,1-dimethylurea and 3-(4-chlorophenyl)-1,1-dimethylurea, 3-phenyl-1,1-dimethylurea and 3-(4-chlorophenyl)-1,1-dimethylurea, imidazolines such as 2-methylimidazoline, 2-phenylimidazoline, 2-undecylimidazoline and 2-heptadecylimidazoline, monoaminopyridines such as 2-aminopyridine, amineimides such as N,N-dimethyl-N-(2-hydroxy-3-allyloxypropyl)amine-N'-lactamide, organic phosphorus-based compounds such as ethylphosphine, propylphosphine, butylphosphine, phenylphosphine, trimethylphosphine, triethylphosphine, tributylphosphine, trioctylphosphine, triphenylphosphine, tricyclohexylphosphine, triphenylphosphine/triphenylborane complex and tetraphenylphosphonium tetraphenylborate, and diazabicycloalkenes such as 1,8-diazabicyclo[5,4,0]undecene-7 and 1,4-diazabicyclo[2,2,2]octane. These curing accelerators may be used singly or in combination of two or more thereof. Preferred among these curing accelerators are imidazole-based compounds and organic phosphorus-based compounds from the standpoint of ease in production of curing accelerator-containing microcapsules and handling.

The polymer comprising as a main component a polymer having a structural unit represented by the foregoing general formula (1) can be obtained by the polyaddition reaction of polyisocyanates with polyvalent amines or the reaction of polyisocyanates with water.

As the foregoing polyvalent isocyanates there can be used any compounds having two or more isocyanate groups per molecule. Specific examples of these polyvalent isocyanates include diisocyanates such as m-phenylenediisocyanate, p-phenylenediisocyanate, 2,4-tolylenediisocyanate, 2,6-tolylenediisocyanate, naphthalene-1,4-diisocyanate, diphenylmethane-4,4'-diisocyanate, 3,3'-dimethoxy-4,4'-biphenyldiisocyanate, 3,3'-dimethyldiphenylmethne-4,4'-diisocyanate, xylylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate and cyclohexylene-1,4-diisocyanate, triisocyanates such as p-phenylenediisothiocyanate, xylylene-1,4-diisothiocyanate and ethylidinediisothiocyanate, tetraisocyanates such as 4,4'-dimethyldiphenylmethane-2,2',1,5,5'-tetraisocyanate, adduct of hexamethylenediisocyanate with hexanetriol, adduct of 2,4-tolylenediisocyanate with Brenzcatechol, adduct of tolylenediisocyanate with hexanetriol, adduct of tolyenediisocyanate with trimethylolpropane, adduct of xylylenediisocyanate with trimethylolpropane, adduct of hexamethylenediisocyanate with trimethylolpropane, and isocyanate prepolymers such as trimer of aliphatic polyvalent isocyanate such as triphenyldimethylenetriisocyanate, tetraphenyltrimethylene tetraisocyanate, pentaphenyltetramethylene pentaisocyanate, lysine isocyanate and hexamethylene diisocyanate. These compounds may be used singly or in combination of two or more thereof.

Preferred among the foregoing polyvalent isocyanates are isocyanate prepolymers represented by polymethylene polyphenyl isocyanates such as adduct of tolylene diisocyanate and trimethylol propane, adduct of xylylene diisocyanate and trimethylolpropane and triphenyl dimethylene triisocyanate from the standpoint of film-forming properties in microencapsulization and mechanical strength.

On the other hand, as the polyvalent amines to be reacted with the polyvalent isocyanates there can be used any compounds having two or more amino groups per molecule. Specific examples of these compounds employable herein include diethylenetriamine, triethylenetetramine, tetraethylene pentamine, 1,6-hexamethylenediamine, 1,8-octamethylene diamine, 1,12-dodecamethylenediamine, o-phenylenediamine, m-phenylenediamine, p-phenylenediamine, o-xylylenediamine, m-xylylenediamine, p-xylylenediamine, menthanediamine, bis(4-amino-3-methylcyclohexyl)methane, isophoronediamine, 1,3-diaminocyclohexane, and spiroacetal-based diamine. These compounds may be used singly or in combination of two or more thereof.

The reaction of the polyvalent isocyanates with water causes hydrolyzation of the polyvalent isocyanates resulting in the production of an amine that is then reacted with unreacted isocyanate groups (so-called self-polyaddition reaction) to produce a polymer comprising as a main component a polymer having a structural unit represented by the general formula (1).

As the polymer constituting the shell portion (wall membrane) there may be used a polyurethane-polyurea having a urethane bond in common with each other produced from the polyvalent isocyanate and a polyvalent alcohol in combination.

As the foregoing polyvalent alcohol there can be used any of aliphatic alcohol, aromatic alcohol and alicyclic alcohol. Examples of the polyvalent alcohol employable herein include catechol, resorcinol, 1,2-dihydroxy-4-methylbenzene, 1,3-dihydroxy-5-methylbenzene, 3,4-dihydroxy-1-methylbenzene, 3,5-dihydroxy-1-methylbenzene, 2,4-dihydroxyethylbenzene, 1,3-naphthalenediol, 1,5- napthalenediol, 2,7-naphthalenediol, 2,3-naphthalenediol, o,o'-biphenol, p,p'-biphenol, bisphenol A, bis-(2-hydroxyphenyl)methane, xylylenediol, ethylene glycol, 1,3-propylene glycol, 1,4-butylene glycol, 1,5-pentanediol, 1,6-hexanediol, 1,7-heptanediol, 1,8-octanediol, 1,1,1,-trimethylolpropane, hexanetriol, pentaerythritol, glycerin, and sorbitol. These compounds may be used singly or in combination of two or more thereof.

The foregoing microcapsule type curing accelerator can be prepared through, e.g., the following three steps.

[1st Step]

The curing accelerator as a core component is dissolved or finely dispersed in a polyvalent isocyanate as a raw material of wall (shell) to form an oil phase. Subsequently, the oil phase thus formed is dispersed in the aqueous medium (aqueous phase) containing a dispersion stabilizer in the form of oil drop to prepare an O/W (oil phase/aqueous phase) emulsion. Subsequently, in the O/W emulsion was dissolved a polyvalent amine to cause interfacial polymerization of the polyvalent amine with the polyvalent isocyanate in the oil phase to initiate polyaddition reaction. Alternatively, the O/W emulsion is heated so that the polyvalent isocyanate in the oil phase reacts with water at the interface with the aqueous phase to produce an amine that subsequently in initiate self-polyaddition reaction. Thus, microcapsules comprising as a shell portion (wall membrane) a polyurea-based polymer, preferably a polyurea having a structural unit represented by the general formula (1) are prepared to obtain a microcapsule dispersion.

On the other hand, when a solid curing accelerator is dissolved in an organic solvent to form a core component, an S/O/W (solid phase/oil phase/aqueous phase) emulsion is obtained. In this type of an emulsion, the curing accelerator is lipophilic. A hydrophilic curing accelerator can be difficultly formed into this type of an emulsion. In this case, however, the solubility of the curing accelerator can be properly adjusted to form an O/O (oil phase/oil phase) emulsion or S/O/O (solid phase/oil phase/oil phase) emulsion which then undergoes interfacial polymerization.

The organic solvent for dissolving the curing accelerator therein is not specifically limited so far as it stays liquid at room temperature. In practice, however, one which does not dissolve the shell portion (wall membrane) therein needs to be selected. Specific examples of the organic solvent employable herein include organic solvents such as ethyl acetate, methyl ethyl ketone, acetone, methylene chloride, xylene, toluene and tetrahydrofuran, and oils such as phenylxylylethane and dialkylnaphthalene.

[2nd Step]

In the microcapsule dispersion obtained at the 1st step is then dissolved or dispersed a blocking agent. In this procedure, the addition of the blocking agent can be effected after the removal of the dispersion stabilizer or unreacted amine from the aqueous phase by centrifugal separation or the like to advantage.

[3rd Step]

The microcapsule dispersion which has been subjected to blocking of amino group with a blocking agent at the 2nd step can be subjected to centrifugal separation, filtration or the like to remove excessive blocking agent, and then dried to prepare a powdered microcapsule type curing accelerator.

Examples of the dispersion stabilizer to be added to the aqueous medium (aqueous phase) at the 1st step include water-soluble high molecular compounds such as polyvinyl alcohol and hydroxymethyl cellulose, and surface active agents such as anionic surface active agent, nonionic surface active agent and cationic surface active agent. Alternatively, hydrophilic inorganic colloidal materials such as colloidal silica and viscous mineral may be used. The amount of such a dispersion stabilizer to be added is preferably predetermined to be from 0.1 to 10% by weight based on the weight of the aqueous phase.

The blocking agent to be used at the 2nd step is not specifically limited so far as it is a compound reactive with amino group. Examples of such a compound employable herein include compounds which react with amino group to form a covalent bond such as epoxy compound, aldehyde compound, acid anhydride, ester compound and isocyanate. Further examples of such a compound include acidic compounds which undergo neutralization reaction with amino group to form a salt such as organic carboxylic acids (e.g., acetic acid, formic acid, lactic acid, oxalic acid and succinic acid, organic sulfonic acids such as p-toluenesulfonic acid, 2-naphthalenesulfonic acid and dodecylbenzenesulfonic acid), phenol compounds, inorganic acids such as boric acid, phosphoric acid, nitric acid, nitrous acid and hydrochloric acid, and solid materials having an acidic surface (e.g., silica, aerogil). Preferred among these compounds are the acidic compounds, which can be used to effectively block the amino group present on and inside the wall membrane. Particularly preferred among these acidic compounds are formic acid and organic sulfonic acids.

The foregoing blocking agent is added in an amount equimolecular with the amino group present on and inside the wall membrane. In practical, when as the blocking agent there is used an acidic compound, the acidic material (acidic compound) is added to the dispersion which has just been subjected to microcapsulization (interfacial polymerization) so that the pH value of the dispersion is adjusted from basicity to acidity, preferably a pH of 2 to 5. Thereafter, the dispersion may be subjected to centrifugal separation, filtration or the like to remove excessive acidic compound.

In the process for the production of a microcapsule type curing accelerator comprising the foregoing 1st to 3rd steps, the 2nd step may also involve the passing of the microcapsule dispersion through an acidic cation exchange column by which the unreacted free amine can be removed or the remaining amino group can be neutralized.

The average particle diameter of the microcapsule type curing accelerator thus obtained is not specifically limited. In practice, however, it is preferably predetermined to a range of from 0.05 to 500 μm, more preferably from 0.1 to 30 μm from the standpoint of uniformity in dispersion. The shape of the microcapsule type curing accelerator is preferably sphere but may be ellipsoid. In the case where the microcapsules are not uniform in particle diameter, e.g., where the microcapsules are ellipsoidal or flat rather than spherical, the value obtained by simply averaging the longest diameter and the shortest diameter is defined as average particle diameter.

The amount of the curing accelerator to be encapsulated in the microcapsule type curing accelerator is preferably predetermined to be from 10 to 95% by weight, particularly from 30 to 80% by weight based on the total amount of microcapsules. In other words, when the amount of the curing accelerator to be encapsulated falls below 10% by weight, the curing reaction time is too long to give sufficient reactivity. On the contrary, when the amount of the curing accelerator to be encapsulated exceeds 95% by weight, the thickness of the resulting wall membrane is too small to provide the core portion (curing agent) with sufficient isolatability and mechanical strength.

The ratio of the thickness of the shell portion (wall membrane) to the particle diameter of the microcapsule type curing accelerator is preferably predetermined to a range of from 3 to 25%, particularly from 5 to 25%. In other words, when the foregoing ratio falls below 3%, the resulting microcapsules cannot be provided with a sufficient mechanical strength against the shear developed at the kneading step during the production of epoxy resin composition. On the contrary, when the foregoing ratio exceeds 25%, there is a tendency that the curing accelerator encapsulated is insufficiently released.

The amount of the latent curing accelerator (component C) to be incorporated is preferably predetermined to a range of from 0.1 to 40 parts by weight (hereinafter abbreviated as "parts"), particularly from 5 to 20 parts based 100 parts of the foregoing embodiments of phenolic resin (components B1 to B3). In other words, when the amount of the latent curing accelerator to be incorporated falls below 0.1 parts, the curing rate is so low that the resulting strength is liable to be lowered. On the contrary, when the amount of the latent curing accelerator to be incorporated exceeds 40 parts, the curing rate is so high that the fluidity is liable to be impaired. The use of the above-described latent curing accelerator generally provides a resin composition showing a viscosity increase of 10 times or less after 72 hours of aging in a 50° C. atmosphere (viscosity measured at 80° C.).

In the invention, as the latent curing accelerator to be used as component C there may be used a commercially available microcapsule type curing accelerator besides the curing accelerator-containing microcapsules so far as the desired object cannot be impaired. Examples of these commercially available microcapsule type curing accelerators include MCE-9957 (comprising as wall membrane methyl methacrylate; produced by NIPPON KAYAKU CO., LTD.), and Novacure produced by Asahi Ciba Co., Ltd. (HX-3748, 3741, 3742, HX-3921HR, HX-3941HP). Even curing accelerators other than microcapsule type curing accelerator may be used such as those having a reduced catalytic activity such as dicyan diamide and Fujicure FXR-1030 and FXE-1000 produced by Fuji Chemical Industry Corp. or if they are ordinary curing accelerators and added in a small amount to give a reduced catalyst activity.

The inorganic filler (component D) to be used as the component C is not specifically limited. Various inorganic fillers may be used. Examples of these inorganic fillers include silica, clay, gypsum, calcium carbonate, barium sulfate, alumina oxide, beryllium oxide, silicon carbide, silicon nitride, and aerogil. These compounds may comprise an electrically-conductive particulate material such as nickel, gold, copper, silver, tin, lead and bismuth incorporated therein. Preferred among these compounds is spherical silica powder, particularly spherical fused silica powder. The average particle diameter of the inorganic filler is preferably from 0.01 to 60 μm, more preferably from 0.1 to 15 μm. The term "spherical" as used herein is meant to indicate that the sphericity is 0.85 or more on the average as measured by a Type FPIA-100 flow type particle image analyzer (produced by SYSMEX INC.).

The content of the inorganic filler (component D) is preferably predetermined to a range of from 15 to 85%, particularly from 50 to 80% based on the total weight of the resin composition for semiconductor encapsulation. In other words, when the content of the inorganic filler falls below 15% by weight, the resulting resin composition for semiconductor encapsulation tends to exhibit a reduced viscosity at 25° C. and thus undergoes sedimentation of inorganic filler during storage or exhibit a high hygroscopicity and hence a deteriorated reliability in humidity resistance. On the contrary, when the content of the inorganic filler exceeds 85%, the resulting resin composition for semiconductor encapsulation tends to exhibit a reduced fluidity and hence deteriorated dischargeability and coatability.

Further, the resin composition for semiconductor encapsulation of the invention may comprise other additives incorporated therein besides the foregoing essential components as necessary.

Examples of the other additives employable herein include fire retardant, wax, leveling agent, anti-foaming agent, pigment, dye, silane coupling agent, and titanate-based coupling agent. Examples of the silane coupling agent employable herein include γ-mercaptopropyl trimethoxysilane, γ-glycidoxypropyl methyl diethoxysilane, β-(3,4-epoxycyclohexyl)ethyltrimethoxysilane, γ-methacryloxypropyl trimethoxysilane, and amino group-containing silane. These silane coupling agents may be used singly or in combination of two or more thereof.

Examples of the fire retardant employable herein include novolak type bromated epoxy resin, and bromated bisphenol A type epoxy resin, metallic compounds such as antimony trioxide, antimony pentaoxide, magnesium hydroxide and aluminum hydroxide, and phosphorus-based compounds such as red phosphorus and ester phosphate. These fire retardants may be used singly or in combination of two or more thereof.

Examples of the wax employable herein include a higher fatty acid, a higher fatty acid ester, a higher fatty acid calcium, and an amide-based compound. These waxes may be used singly or in combination of two or more thereof.

The resin composition for semiconductor encapsulation of the invention may comprise a silicone oil, silicone rubber, synthetic rubber or reactive diluent incorporated therein besides the above-described other additives to reduce the resulting stress. The resin composition for semiconductor encapsulation of the invention may comprise an ion trap agent such as hydrotalcite and bismuth hydroxide for the purpose of enhancing the reliability in the humidity resistance reliability test.

The resin composition for semiconductor encapsulation of the invention can be prepared, e.g., in the following manner. In some detail, the foregoing components A to D and optionally other additives are mixed, and then kneaded under heating in a kneader such as universal agitator so that it is melt-mixed. Subsequently, the mixture is cooled to room temperature (approx. 25° C.) to produce the desired resin composition for semiconductor encapsulation. In order to adjust the fluidity of the resin composition for semiconductor encapsulation, an organic solvent may be added. Examples of the organic solvent employable herein include toluene, xylene, methyl ethyl ketone (MEK), acetone, and diacetone alcohol. These organic solvents may be used singly or in combination of two or more thereof.

The viscosity of the resin composition for semiconductor encapsulation thus obtained must be predetermined to a range of from 7,000 poise or more at 25° C. and 5,000 poise or less at 80° C., particularly 7,000 poise or more at 25° C. and 3,000 poise or less at 80° C. The lower limit of the viscosity of the resin composition for semiconductor encapsulation at 80° C. is generally 1.0 poise. In other words, when the viscosity of the resin composition for semiconductor encapsulation falls below 7,000 poise at 25° C. and exceeds 5,000 poise at 80° C., the resulting resin composition for semiconductor encapsulation exhibits deteriorated storage stability, dischargeability and coatability and thus cannot satisfy the desired requirements.

The viscosity of the resin composition for semiconductor encapsulation at 25° C. and 80° C. can be measured by an E type viscometer as follows.

[Viscosity at 25° C.]

For the measurement of viscosity at 25° C., a Type RE80U viscometer comprising a cone rotor having a size of 3° and R7.7 produced by Toki Sangyo Co., Ltd. was used. The sample was pretreated at a cone rotor rotary speed of 1 rpm for 1 minute at 25° C., and then allowed to stand at 0.1 rpm for 10 minutes at 25° C. before measurement.

[Viscosity at 80° C.]

For the measurement of viscosity at 80° C., a Type RE80R viscometer produced by Toki Sangyo Co., Ltd. was used. For the sample having a viscosity of less than 1,000 poise, a cone rotor having a size of 3°×R14 was used. For the sample having a viscosity of 1,000 poise or more, a cone rotor having a size of 3°×R7.7 was used. The sample was pretreated at a cone rotor rotary speed of 1 rpm for 1 minute at 80° C., and then allowed to stand at 0.5 rpm for 10 minutes at 80° C. before measurement.

The production of a semiconductor device from the resin composition for semiconductor encapsulation of the invention is accomplished by various known methods. In mounting by flip chip, COB, graph top, cavity fill, etc., the resin composition for semiconductor encapsulation which has been heated (to a temperature of from about 40° C. to 90° C., preferably from about 60° C. to 80° C.) is supplied by means of a dispenser so that the semiconductor element is potted. The resin composition is then heated and cured to form an encapsulating resin layer. Thus, a semiconductor device can be produced. Alternatively, a solid or semi-solid resin composition for semiconductor encapsulation may be directly adhered or applied to the semiconductor element, etc., and then heated and cured to form an encapsulating resin layer. Thus, a semiconductor device can be produced. The mounting may be effected in vacuo.

Among the foregoing-processes for the production of a semiconductor device, flip chip mounting will be further described herein after with reference to side fill encapsulation process, press bump encapsulation process and printing encapsulation process.

[Side Fill Encapsulation Process]

A wiring circuit board having semiconductor elements provided thereon with a plurality of connecting electrode portions interposed therebetween is prepared. The gap between the wiring circuit board and semiconductor elements which have been previously heated (to a temperature of from about 40° C. to 130° C., preferably from 60° C. to 100° C.) is then filled with the resin composition for semi conductor encapsulation which has been heated (to a temperature of from about 40° C. to 90° C., preferably from about 60° C. to 80° C.) and injected by means of a dispenser. The resin composition thus injected is then heated and cured to form an encapsulating resin layer. In this manner, a semiconductor device can be produced by flip chip mounting.

Alternatively, a solid or semi-solid resin composition for semiconductor encapsulation which has not previously been heated may be directly applied onto the semiconductor elements or to the area in the vicinity thereof, and then heated and cured to form an encapsulating resin layer in the gap between the semiconductor elements and the wiring circuit board.

The production of a semiconductor by side fill encapsulation process may be effected in vacuo. As the apparatus for the production of such a semiconductor device in vacuo there may be used a Type MBC-V Series produced by Musashi Engineering Co., Ltd. The foregoing production of a semiconductor device in vacuo may be accomplished by differential pressure filling method which comprises filling of the gap between the wiring circuit board and the semiconductor elements in vacuo with the resin composition for semiconductor encapsulation which has been injected by means of a dispenser and subsequent filling the gap with the resin composition at atmospheric pressure.

[Press Bump Encapsulation Process]

The resin composition for semiconductor encapsulation which has been heated (to a temperature of from about 40° C. to 90 C, preferably from 60° C. to 80° C.) is applied onto the wiring circuit board by means of a dispenser so that the semiconductor elements are potted. Thereafter, press bump connection process using a flip chip bonder or the like is effected to carry out the electrical connection between the semiconductor elements and the wiring circuit board and the formation of an encapsulating resin layer at the same time. In this manner, a semiconductor device can be produced by flip chip mounting.

Alternatively, a solid or semi-solid resin composition for semiconductor encapsulation which has not previously been heated may be directly applied to the semiconductor elements or wiring circuit board, followed by press bump connection process. In this manner, the connection between the semiconductor elements and the wiring circuit board and the formation of an encapsulating resin layer can be effected at the same time.

The production of a semiconductor device by press bump encapsulation process may be effected in vacuo.

Instead of potting by means of a dispenser, printing may be effected to apply the resin composition if possible, followed by press bump connection process by flip chip bonder or the like which effects the electrical connection between the semiconductor elements and the wiring circuit board and the formation of an encapsulating resin layer at the same time. In the application by printing, the printing atmosphere may be entirely heated or the mask or squeegee may be partly heated (to a temperature of from about 40° C. to 100° C.).

[Printing Encapsulation Process]

A wiring circuit board having semiconductor elements provided thereon with a plurality of connecting electrode portions interposed therebetween is prepared. The resin composition for semiconductor encapsulation which has been heated (to a temperature of from about 40° C. to 90° C., preferably from about 60° C. to 80° C.) is then dropped into the gap between the wiring circuit board and semiconductor elements which has previously been heated (to a temperature of from about 40° C. to 130° C., preferably from about 60° C. to 100° C.) by means of a dispenser so that printing encapsulation is effected to form an encapsulating resin layer. In this manner, a semiconductor device can be produced by flip chip mounting.

The printing encapsulation process is preferably accomplished by the use of a Type VPE-100 Series vacuum printing encapsulation apparatus using vacuum differential pressure (produced by Toray Engineering Co., Ltd.) because air bubbles can hardly enter into the encapsulating resin layer.

Alternatively, a solid or semi-solid resin composition for semiconductor encapsulation which has not previously been heated may be directly applied to a stage or squeegee so that printing encapsulation can be effected.

On the other hand, among the foregoing processes for the production of a semiconductor device, the cavity fill process for the production of a semiconductor device will be further described hereinafter.

A wiring circuit board having semiconductor elements provided thereon in such an arrangement that the semiconductor elements are electrically connected thereto through a bonding wire or the like is prepared. The resin composition for semiconductor encapsulation which has been heated (to a temperature of from about 40° C. to 90° C., preferably from about 60° C. to 80° C.) is then applied to the wiring circuit board and semiconductor elements which has previously been heated (to a temperature of from about 40° C. to 130° C., preferably from about 60° C. to 100° C.) by means of a dispenser so that the semiconductor elements are potted. The resin composition is then heated and cured so that an encapsulating resin layer is formed to encapsulate the semiconductor elements. In this manner, a cavity fill type of semiconductor device can be produced.

Alternatively, a solid or semi-solid resin composition for semiconductor encapsulation which has not previously been heated may be directly adhered or applied to the semiconductor elements, and then heated and cured to form an encapsulating resin layer in such an arrangement that the semiconductor elements are encapsulated.

The production of a semiconductor device by the foregoing encapsulation method may be effected in vacuo. As the apparatus for the production of such a semiconductor device in vacuo there may be used a Type MBC-V Series produced by Musashi Engineering Co., Ltd.

Other processes for the production of a semiconductor device will be further described hereinafter. A wiring circuit board having semiconductor elements provided thereon in such an arrangement that the semiconductor elements are electrically connected thereto through a bonding wire or the like is prepared. The resin composition for semiconductor encapsulation which has been heated (to a temperature of from about 40° C. to 90° C., preferably from about 60° C. to 80° C.) is then supplied on the wiring circuit board and semiconductor elements which have previously been heated (to a temperature of from about 40° C. to 130° C., preferably from 60° C. to 100° C.) by printing or the like, and then heated and cured to form an encapsulating resin layer in such an arrangement that the semiconductor elements are encapsulated. In this manner, a cavity fill type of semiconductor device can be produced.

The production of a semiconductor device by printing encapsulation process may be effected in vacuo. In the procedure of producing a semiconductor device in vacuo, printing encapsulation in vacuo may be followed by the rise in the atmospheric pressure that causes the removal of voids from the resin composition for semiconductor encapsulation. Finish printing may be then effected under these conditions.

The semiconductor device is then placed on a mounting board (mother board) to produce a semiconductor product. In some detail, the semiconductor device is mounted on the mounting board (motherboard) with a plurality of connecting electrode portions being provided interposed therebetween and its wiring circuit board being opposed to the mounting board. At the same time, the gap between the mounting board and the semiconductor device is filled with the resin composition for semiconductor encapsulation of the invention which is then heated and cured to form an encapsulating resin layer. In this manner, a semiconductor product is produced.

The method for heating and curing the resin composition for semiconductor encapsulation is not specifically limited. In practice, however, a heating method using a convection dryer, IR reflow furnace, hot plate or the like can be used.

Examples of the method for filling the gap between the mounting board and the semiconductor device with the resin composition for semiconductor encapsulation of the invention include the same methods as described with flip chip mounting among the processes for the production of a semiconductor device mentioned above, i.e., side fill encapsulation process, press bump encapsulation process, printing encapsulation process, etc. The resin composition for semiconductor encapsulation may comprise an electrically-conductive particulate material such as nickel, gold, silver, copper, tin, lead and bismuth dispersed therein to form ACF (Anisotropic Conductive Film) or ACP (Anisotropic Conductive Paste) which is then used for flip chip mounting. In other embodiments, the resin composition for semiconductor encapsulation may be applied to the wiring circuit board as a damming material or may be used as an adhesive for bonding the wiring circuit board to the heat radiator or a die-bonding agent.

The production of a semiconductor device comprising the resin composition for semiconductor encapsulation of the invention which has been provided on a semiconductor wafer or matrix wiring circuit board can be accomplished by various known methods.

The production of a semiconductor device will be described with reference to the case where the resin composition for semiconductor encapsulation of the invention is applied to a semiconductor wafer having a plurality of semiconductor elements with protruding electrode portions formed thereon. In some detail, the resin composition for semiconductor encapsulation which has been heated (to a temperature of from about 40° C. to 90° C., preferably from about 60° C. to 80° C.) is applied to the protruding electrode portion side of the semiconductor wafer by means of a dispenser to form a resin layer made of the resin composition for semiconductor encapsulation to a predetermined thickness. The formation of a resin layer made of the resin composition for semiconductor encapsulation to a predetermined thickness is effected in such a manner that at least the forward end of the protruding electrode portion is exposed to the exterior of the resin layer. Subsequently, the semiconductor wafer having a resin layer formed thereon is cut to produce a semiconductor device.

The formation of a resin layer made of the resin composition for semiconductor encapsulation can be carried out by printing through an opening in the mask.

The resin layer thus formed may be in any state so far as it is eventually thermoset. The heating and curing of the resin layer may be effected before or after cutting of the semiconductor wafer.

On the other hand, the resin composition for semiconductor encapsulation is supplied onto the whole of a plurality of semiconductor elements mounted on a matrix wiring circuit board having individual wiring circuits formed thereon to form a resin layer in such an arrangement that the semiconductor elements are encapsulated. Subsequently, the resin layer is thermoset to encapsulate the plurality of semiconductor elements with the resin composition. The plurality of semiconductor elements thus encapsulated are then cut every semiconductor element to produce semiconductor devices.

The resin layer thus formed may be in any state so far as it is eventually thermoset. The heating and curing of the resin layer may be effected before or after cutting of the semiconductor elements.

As the method for forming the resin layer made of the resin composition for semiconductor encapsulation there may be used a method using a dispenser, a method involving printing through an opening in the mask or the like similarly to the method previously mentioned.

Alternatively, the resin composition for semiconductor encapsulation is supplied onto the protruding electrode portion side of a semiconductor wafer having a plurality of semiconductor elements with protruding electrode portions formed thereon to form a resin layer to a predetermined thickness. The semiconductor wafer having a resin layer formed thereon is then cut to individual semiconductor elements. Subsequently, the wiring circuit board and the semiconductor elements are contact-bonded to each other under heating with the resin layer side of the semiconductor elements thus separated and the plurality of wiring circuit boards being opposed to each other so that they are electrically connected to each other. At the same time, the resin layer is melted and cured to form an encapsulating resin layer between the semiconductor elements and the wiring circuit boards so that the semiconductor elements are encapsulated. In this manner, a semiconductor device is produced.

Alternatively, the resin composition for semiconductor encapsulation is supplied onto a matrix wiring circuit board having individual wiring circuits formed thereon to form a resin layer. The wiring circuit board having a resin layer formed thereon is then cut to individual wiring circuit boards. Subsequently, semiconductor elements each provided with a plurality of connecting electrode portions and the wiring circuit boards thus separated are contact-bonded to each other under heating with the connecting electrode portion side of the semiconductor elements and the wiring circuit boards being opposed to each other so that they are electrically connected to each other. At the same time, the resin layer is melted and cured to form an encapsulating resin layer between the semiconductor elements and the wiring circuit boards so that the semiconductor elements are encapsulated. In this manner, a semiconductor device is produced.

As the method for forming the resin layer made of the resin composition for semiconductor encapsulation there may be used a method using a dispenser, a method involving printing through an opening in the mask or the like similarly to the method previously mentioned.

The present invention will be further described in the following examples and comparative examples, but the present invention should not be construed as being limited thereto.

(1) Examples and comparative examples of the first embodiment of the resin composition for semiconductor encapsulation (combination of a liquid epoxy resin and a solid phenolic resin) will be described hereinafter.

The following various components were prepared prior to these examples.

[Epoxy Resin aa1]
Bisphenol F type epoxy resin (Epo Tohto YDF-8170, produced by Tohto Kasei Co., Ltd.; liquid at 25° C.; epoxy equivalent: 158 g/eq)

[Epoxy Resin aa2]
Bisphenol A type epoxy resin (DER-332, produced by The Dow Chemical Company; liquid at 25° C.; epoxy equivalent: 170 g/eq)

[Epoxy Resin aa3]
Alicyclicepoxy resin (Celloxide 2021P, produced by DAISEL CHEMICAL INDUSTRIES, LTD; liquid at 25° C.; epoxy equivalent: 135 g/eq)

[Phenolic Resin ba1]
Tetrafunctional phenolic resin represented by the following chemical formula (ba1) (THD-2344, produced by Honshu Chemical Industry Co., Ltd.; solid at 25° C.; melting point: 187° C.; purity: 94%)

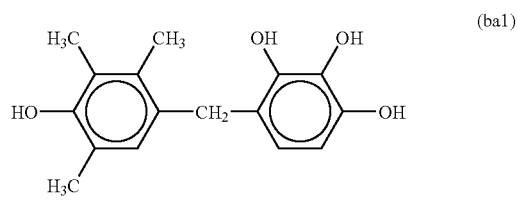

[Phenolic Resin ba2]
Pentafunctional phenolic resin represented by the following chemical formula (ba2) (Bis PG-26X, produced by Honshu Chemical Industry Co., Ltd.; solid at 25° C.; melting point: 182° C.; purity: 97.5%)

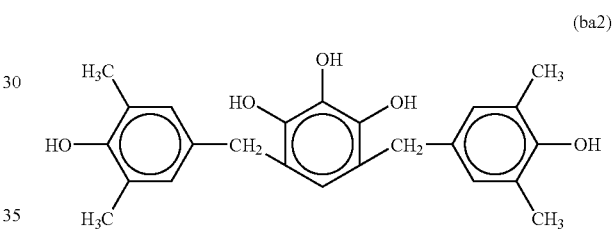

[Phenolic Resin ba3]
Tetrafunctional phenolic resin represented by the following chemical formula (ba3) (MHD-2344, produced by Honshu Chemical Industry Co., Ltd.; solid at 25° C.; melting point: 156° C.; purity: 93.6%)

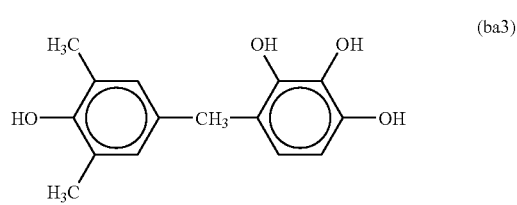

[Phenolic Resin ba4]
Trifunctional phenolic resin represented by the following chemical formula (ba4) (HDM-234, produced by Honshu Chemical Industry Co., Ltd.; solid at 25° C.; melting point: 94° C.; purity: 98%)

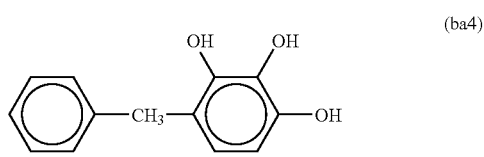

[Phenolic Resin ba5]

Solid phenolic resin represented by the following chemical formula (ba5) (Tris P-RK, produced by Honshu Chemical Industry Co., Ltd.; solid at 25° C.; melting point: 95° C.; purity: 89%)

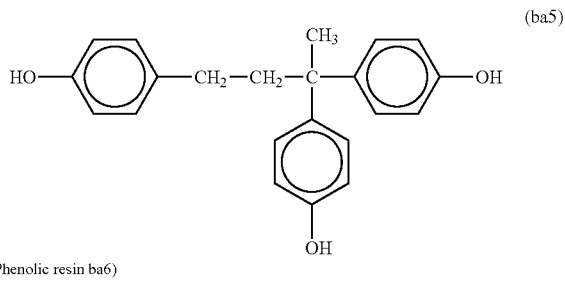

(Phenolic resin ba6)

Triphenylmethane type phenolic resin (MEH-7500 (3,4P) produced by Meiwa Kasei Co., Ltd.; solid at 25° C.; hydroxyl equivalent: 101 g/eq; melting point: 110° C.; 150° C. viscosity: 3 to 4 poise)

[Phenolic Resin ba7]

p-Ethylphenol resin represented by the following chemical formula (ba7) (produced by Meiwa Kasei Co., Ltd.; solid at 25° C.; hydroxyl equivalent: 129 g/eq; melting point: 98° C.)

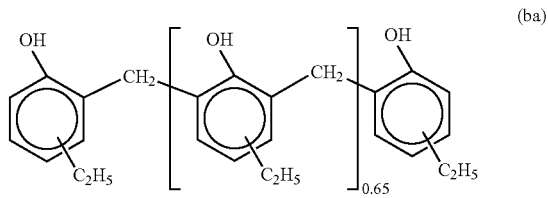

[Phenolic Resin ba8]

Allylated phenol novolak (MEH-8005H, produced by Meiwa Kasei Co., Ltd.; liquid at 25° C.; hydroxyl equivalent: 135 g/eq)

[Acid Anhydride-Based Curing Agent]

Methylhexahydrophthalic anhydride (methylated HHPA, Rikacid MH-700, produced by New Japan Chemical Co., Ltd.)

[Curing Accelerator c1]

A microcapsule type curing accelerator was prepared in accordance with the method previously mentioned. In some detail, 11 parts of an adduct of 3 mols of xylylene diisocyanate and 1 mol of trimethylolpropane and 4.6 parts of an adduct of 3 mols of tolylene diisocyanate and 1 mol of trimethylolpropane were uniformly dissolved in a mixture of 7parts of triphenylphosphine and 3.9 parts of ethyl acetate as curing accelerators to prepare an oil phase. Separately, an aqueous phase comprising 100 parts of distilled water and 5 parts of a polyvinyl alcohol was prepared. To the aqueous phase thus prepared was then added the oil phase prepared as above. The mixture was then subjected to emulsification by means of a homomixer to form an emulsion. The emulsion thus formed was then charged into a polymerization reactor equipped with a reflux tube, an agitator and a dropping funnel.

On the other hand, 10 parts of an aqueous solution containing 3 parts of triethylenetetramine were prepared. The aqueous solution thus prepared was then put into the dropping funnel provided in the foregoing polymerization reactor. The aqueous solution was dropped into the emulsion in the reactor where interfacial polymerization took place at a temperature of 70° C. for 3 hours to obtain an aqueous suspension of microcapsule type curing accelerator. Subsequently, the aqueous suspension was subjected to centrifugal separation to remove the polyvinyl alcohol, etc. from the aqueous phase. To the residue were then added 100 parts of distilled water. The mixture was then subjected to dispersion to obtain a suspension.

To the suspension was then added formic acid to adjust the pH value of the system to 3. In this manner, a microcapsule type curing accelerator in which the amino group present on and inside the wall membrane had been blocked with formic acid was prepared. The microcapsule type curing accelerator thus obtained was repeatedly subjected to centrifugal separation and rinsing, and then dried to isolate the microcapsule type curing accelerator as a free-flowing powder. The average particle diameter of the microcapsule type curing accelerator was 2 μm. The ratio of the shell thickness to the particle diameter of microcapsules was 15%. The encapsulated amount of triphenylphosphine was 30% by weight based on the total amount of the microcapsule type curing accelerator.

[Curing Accelerator c2]

MCE-9957 produced by NIPPON KAYAKU CO., LTD.

[Curing Accelerator c3]

2-Ethyl-4-methylimidazole (Curezol 2E4MZ, produced by Shikoku Chemicals Corp.)

[Inorganic Filler d1]

Spherical fused silica powder (SP-4B, produced by TONEN CHEMICAL CORPORATION; average particle diameter: 5.0 μm)

[Inorganic Filler d2]

Spherical fused silica powder (FB-48X, produced by DENKI KAGAKU KOGYO K. K.; average particle diameter: 15 μm)

[Inorganic Filler d3]

Spherical fused silica powder (SE-2100, produced by Admatechs Co., Ltd.; average particle diameter: 0.56 μm)

EXAMPLES a1–a12; COMPARATIVE EXAMPLES a1–a4; CONVENTIONAL EXAMPLES

The foregoing various components were mixed in proportions set forth in Tables 1 to 3 below, and then kneaded in a universal agitator so that they were melt-mixed. Subsequently, the mixture was cooled to room temperature to prepare the desired resin compositions for semiconductor encapsulation. The kneading conditions were as follows.

EXAMPLES a1–a8; COMPARATIVE EXAMPLE a4

The epoxy resin and the phenolic resin were charged into the universal agitator where they were stirred at a temperature of 150° C. for 2 minutes to dissolve all the solid contents. Subsequently, the temperature of the solution was lowered to a range of from 90° C. to 100° C. To the solution was then added the inorganic filler. The mixture was then stirred for 10 minutes. The mixture was then adjusted to a temperature of 75° C. To the mixture was then added the curing accelerator. The mixture was then stirred for 2 minutes for use.

EXAMPLES a9–a12; COMPARATIVE EXAMPLES a2, a3

The epoxy resin and the phenolic resin were charged into the universal agitator where they were then stirred at a temperature of 110° C. for 5 minutes to dissolve all the solid contents. Subsequently, the temperature of the solution was lowered to a range of from 90° C. to 100° C. To the solution was then added the inorganic filler. The mixture was then stirred for 10 minutes. The mixture was then adjusted to a temperature of 65° C. To the mixture was then added the curing accelerator. The mixture was then stirred for 2 minutes for use.

COMPARATIVE EXAMPLE a1; CONVENTIONAL EXAMPLE

The epoxy resin, the phenolic resin or the acid anhydride were charged into the universal agitator where they were then stirred at a temperature of 80° C. for 10 minutes. Thereafter, the mixture was stirred with the inorganic filler at the same temperature for 10 minutes. The temperature of the mixture was then lowered to 50° C. To the mixture was then added the curing accelerator. The mixture was then stirred for 2 minutes for use.

TABLE 1

(Unit: parts)

| | | Example No. | | | | | |
|---|---|---|---|---|---|---|---|
| | | a1 | a2 | a3 | a4 | a5 | a6 |
| Epoxy resin | aa1 | 404 | 404 | 341 | 358 | 414 | 207 |
| | aa2 | — | — | — | — | — | — |
| | aa3 | — | — | — | — | — | — |
| Phenolic resin | ba1 | 93.9 | 93.9 | — | — | — | — |
| | ba2 | 93.9 | 93.9 | 77 | 80.7 | 93 | 46.5 |
| | ba3 | — | — | 77 | 80.7 | 93 | 46.5 |
| | ba4 | — | — | — | — | — | — |
| | ba5 | — | — | — | — | — | — |
| | ba6 | — | — | — | — | — | — |
| | ba7 | — | — | — | — | — | — |
| | ba8 | — | — | — | — | — | — |
| Acid anhydride-based curing accelerator | | — | — | — | — | — | — |
| Curing accelerator | c1 | 21.8 | — | 18.0 | 18.7 | 21.6 | 10.9 |
| | c2 | — | 32.9 | — | — | — | — |
| | c3 | — | — | — | — | — | — |
| Inorganic filler | d1 | 140 | 140 | 1005 | 962 | 900 | 190 |
| | d2 | 746 | 746 | — | — | — | 1010 |
| Content of inorganic filler in total amount (wt %) | | 59 | 59 | 66 | 64 | 59 | 79 |

TABLE 2

(Unit: parts)

| | | Example No. | | | | | |
|---|---|---|---|---|---|---|---|
| | | a7 | a8 | a9 | a10 | a11 | a12 |
| Epoxy resin | aa1 | 311 | 825 | — | 366 | — | 285 |
| | aa2 | — | — | 420 | — | — | — |
| | aa3 | — | — | — | — | 300 | — |
| Phenolic resin | ba1 | — | — | — | — | — | — |
| | ba2 | 69.8 | 186 | — | — | — | — |
| | ba3 | 69.8 | 186 | — | — | — | — |
| | ba4 | — | — | 173 | — | — | — |
| | ba5 | — | — | — | — | — | 301 |
| | ba6 | — | — | — | 234 | — | — |
| | ba7 | — | — | — | — | 287 | — |
| | ba8 | — | — | — | — | — | — |
| Acid anhydride-based curing accelerator | | — | — | — | — | — | — |
| Curing accelerator | c1 | 16.4 | 43.5 | 20.0 | 27.4 | 33.5 | 35.2 |
| | c2 | — | — | — | — | — | — |
| | c3 | — | — | — | — | — | — |
| Inorganic filler | d1 | 167 | 47.3 | 140 | 900 | 139 | 139 |
| | d2 | 884 | 253 | 747 | — | 741 | 740 |
| Content of inorganic filler in total amount (wt %) | | 69 | 19 | 59 | 59 | 59 | 59 |

TABLE 3

(Unit: parts)

| | | Comparative example | | | | Conventional example |
|---|---|---|---|---|---|---|
| | | a1 | a2 | a3 | a4 | |
| Epoxy resin | aa1 | 239 | 206 | — | 186 | 290 |
| | aa2 | — | 213 | 420 | — | — |
| | aa3 | — | — | — | — | — |
| Phenolic resin | ba1 | — | — | — | — | — |
| | ba2 | — | — | — | 41.9 | — |
| | ba3 | — | — | — | 41.9 | — |
| | ba4 | — | 181 | 173 | — | — |
| | ba5 | — | — | — | — | — |
| | ba6 | — | — | — | — | — |
| | ba7 | — | — | — | — | — |
| | ba8 | 204 | — | — | — | — |
| Acid anhydride-based curing accelerator | | — | — | — | — | 308 |
| Curing accelerator | c1 | 23.8 | 21.2 | — | 9.8 | — |
| | c2 | — | — | — | — | — |
| | c3 | — | — | 3.5 | — | 6.1 |
| Inorganic filler | d1 | 164 | 142 | 140 | 195 | 142 |
| | d2 | 869 | 757 | 747 | 1035 | 754 |
| Content of inorganic filler in total amount (wt %) | | 69 | 59 | 60 | 81 | 60 |

The resin compositions for semiconductor encapsulation of examples and comparative examples thus obtained were each measured for viscosity at 25° C. and 80° C. by means of an E type viscometer in accordance with the foregoing methods. These resin compositions for semiconductor encapsulation were each then measured and evaluated for glass transition temperature (Tg), storage stability (degree of sedimentation of inorganic filler, degree of change of viscosity), dischargeability, coatability and pot life in accordance with the following methods. The semiconductor devices produced from the foregoing resin compositions for semi conductor encapsulation were then measured and evaluated for reliability in humidity resistance in accordance with the following method. The results are set forth in Tables 4 to 7 below.

[Glass Transition Temperature (Tg)]

A test piece obtained by curing the resin composition for semiconductor encapsulation which had previously been defoamed at a temperature of 150° C. for 3 hours was measured for glass transition temperature by means of TMA apparatus (model # MG800GM) produced by Rigaku Corp. The measurement was effected at a temperature rising rate of 5° C./min under a load of 30 g. The measurements were then plotted with elongation as ordinate and temperature as abscissa to make a graph. The point of intersection of the tangential line between 50° C. and 70° C. and the tangential line between 200° C. and 230° C. was defined as Tg.

[Storage Stability]

*1: Degree of Sedimentation of Inorganic Filler

Into a test tube having an inner diameter of 16 mmφ and a height of 180 mm was put the resin composition for semiconductor encapsulation to a height of 120 mm. The test tube was then capped. The test specimen was allowed to stand at a temperature of 25° C. for 30 days, and then confirmed for the degree of sedimentation of inorganic filler. In order to judge if sedimentation takes place or not, the change in turbidity was visually confirmed by making the use of the fact that where the inorganic filler is sedimented, the level of turbidity of the resin composition for semiconductor encapsulation changes. When the turbidity decreases (transparency increases), it is defined that sedimentation takes place. In some detail, when the height of the sedimented portion is 1 mm or more, it is defined that sedimentation takes place. This state is represented by the mark X. When there is no sedimented portion, it is defined that no sedimentation takes place. This state is represented by the mark ⊚.

*2: Degree of Viscosity Change

The resin composition for semiconductor encapsulation was allowed to stand in a 25° C. atmosphere for 30 days. The sample was measured for viscosity before and after aging by means of an E type viscometer (measuring temperature: 80° C. (25° C. for conventional example). When the viscosity after aging is 1.5 times or less that before aging, it is judged as ⊚. When the viscosity after aging is from more than 1.5 times to 3.0 times or less that before aging, it is judged as ○. When the viscosity after aging is from more than 3.0 times to 10 times or less that before aging, it is judged as Δ. When the viscosity after aging is more than 10 times that before aging, it is judged as X. The measurement of viscosity by means of an E type viscometer was effected in the same manner as the measurement of viscosity at 25° C. or 80° C.

[Dischargeability, Coatability]

For the evaluation of dischargeability, the amount of the resin composition for semiconductor encapsulation discharged through a dispenser under specific time and pressure conditions was determined. In some detail, using a 10 cc syringe produced by Musashi Engineering Co., Ltd. and a Type SN-17G metallic needle (inner diameter: 2.4 mm), the discharged amount of the resin composition was measured after 10 seconds at 5 kg/cm². When the discharged amount is 1,000 mg or more, it is defined as ⊚. When the discharged amount is from 200 mg or more to less than 1,000 mg or more, it is defined as ○. When the discharged amount is from 50 mg or more to less than 200 mg or more, it is defined as Δ. When the discharged amount is less than 50 mg, it is defined as X. When the discharged amount is less than 50 mg, the level of encapsulation of semiconductor with resin is unacceptable.

[Pot Life (Viscosity Change)]

The various resin compositions for semiconductor encapsulation were each measured for viscosity before and after aging at a temperature of 50° C. for 72 hours by means of an E type viscometer (measuring temperature: 80° C. (25° C. for conventional example)). When the viscosity after aging is 1.5 times or less that before aging, it is defined as ⊚. When the viscosity after aging is from more than 1.5 times to 3.0 times or less that before aging, it is defined as ○. When the viscosity after aging is from more than 3.0 times to 10 times or less that before aging, it is defined as Δ. When the viscosity after aging is more than 10 times that before aging, it is defined as X. The measurement of viscosity by means of an E type viscometer was effected in the same manner as the measurement of viscosity at 25° C. or 80° C.

[Reliability in Humidity Resistance]

Semi conductor devices were produced from the various resin compositions for semiconductor encapsulation. In some detail, a dual in-line package (DIP) having semiconductor chips mounted thereon was set in a DIP mold. The mold was then heated to a temperature of 140° C. (110° C. for conventional example). The resin composition for semiconductor encapsulation which had previously been defoamed and melted at a temperature of from 60° C. to 120° C. was dropped onto the mold, and then cured at a temperature of 150° C. for 3 hours (at a temperature of 110° C. for 20 hours for conventional example) to produce a semiconductor device. The semiconductor device was then subjected to aging under humidity conditions of 130° C., 85% RH and 2.3 atm (applied bias voltage: 30 V). The various patterns were then checked for continuity. When the pattern is found discontinuous, it is defined as defective. The check for continuity was conducted on the sample which had been withdrawn to room temperature. The time at which the percent defective of package [(number of defective patterns/number of patterns)×100] reaches 50% was then confirmed. Other conditions were as follows:

Package evaluated: DIP16

Lead frame: 4.2 alloy; thickness: 0.25 mm

Chip: All surface Al model element (3×6 mm), produced by Shinko K. K. (Al pattern: thickness: 5 μm; width: 5 μm)

Wire: 99.99%; Gold SR 25 μmφ (diameter)

Ag paste: EN-4000, produced by Hitachi Chemical Co., Ltd.

Number evaluated (n): 10 packages/sample (one package comprises two patterns connected to positive electrode and two patterns connected to negative electrode, giving a total of 40 measurable patterns)

PCT conditions: 130° C.×85% RH×2.3 atm (applied bias voltage: 30 V)

TABLE 4

|  | Example No. | | | |
| --- | --- | --- | --- | --- |
|  | a1 | a2 | a3 | a4 |
| Properties at 25° C. | Semi-solid | Semi-solid | Semi-solid | Semi-solid |
| Viscosity 25° C. | 105000 | 104000 | >300000 | >300000 |
| (poise) 80° C. | 25 | 24 | 4600 | 2500 |
| Glass transition temp. (° C.) | 137 | 136 | 134 | 134 |
| Storage *1 | ⊚ | ⊚ | ⊚ | ⊚ |
| stability *2 | ⊚ | ○ | ⊚ | ⊚ |
| Dischargeability, coatability | ⊚ | ⊚ | ○ | ⊚ |

TABLE 4-continued

| | Example No. | | | |
|---|---|---|---|---|
| | a1 | a2 | a3 | a4 |
| Pot life | ◉ | ○ | ◉ | ◉ |
| Reliability in humidity resistance (PCT) | 200< | 200< | 200< | 200< |

*1: Degree of sedimentation of inorganic filler
*2: Degree of viscosity change

TABLE 5

| | Example No. | | | |
|---|---|---|---|---|
| | a5 | a6 | a7 | a8 |
| Properties at 25° C. | Semi-solid | Solid | Semi-solid | Semi-solid |
| Viscosity 25° C. (poise) | 17400 | solid | 161000 | 13200 |
| 80° C. | 1300 | 3070 | 68 | 16 |
| Glass transition temp. (° C.) | 135 | 134 | 135 | 136 |
| Storage *1 | ◉ | ◉ | ◉ | ◉ |
| stability *2 | ◉ | ◉ | ◉ | ◉ |
| Dischargeability, coatability | ◉ | ○ | ◉ | ◉ |
| Pot life | ◉ | ◉ | ◉ | ◉ |
| Reliability in humidity resistance (PCT) | 200< | 200< | 200< | 100 |

*1: Degree of sedimentation of inorganic filler
*2: Degree of viscosity change

TABLE 6

| | Example No. | | | |
|---|---|---|---|---|
| | a9 | a10 | a11 | a12 |
| Properties at 25° C. | Semi-solid | Solid | Semi-solid | Solid |
| Viscosity 25° C. (poise) | 9600 | solid | 11400 | Solid |
| 80° C. | 10 | 160 | 25 | 328 |
| Glass transition temp. (° C.) | 120 | 129 | 112 | 107 |
| Storage *1 | ◉ | ◉ | ◉ | ◉ |
| stability *2 | ◉ | ◉ | ○ | ◉ |
| Dischargeability, coatability | ◉ | ◉ | ◉ | ◉ |
| Pot life | ◉ | ◉ | ○ | ◉ |
| Reliability in humidity resistance (PCT) | 180 | 200< | 90 | 180 |

*1: Degree of sedimentation of inorganic filler
*2: Degree of viscosity change

TABLE 7

| | Comparative Example No. | | | | Conventional |
|---|---|---|---|---|---|
| | a1 | a2 | a3 | a4 | example |
| Properties at 25° C. | Liquid | Liquid | Semi-solid | Solid | Liquid |
| Viscosity 25° C. (poise) | 5700 | 6500 | 11000 | Solid | 850 |
| 80° C. | 15 | 33 | 15 | 5600 | 15 |
| Glass transition temp. (° C.) | 59 | 126 | 130 | 133 | 140 |
| Storage *1 | X | X | ◉ | ◉ | X |
| stability *2 | ◉ | ◉ | X | ◉ | X |

TABLE 7-continued

| | Comparative Example No. | | | | Conventional |
|---|---|---|---|---|---|
| | a1 | a2 | a3 | a4 | example |
| Dischargeability, coatability | ◉ | ◉ | ◉ | X | ◉ |
| Pot life | ◉ | ◉ | X | ◉ | Δ |
| Reliability in humidity resistance (PCT) | 70 | 190 | 60 | 190 | 20 |

*1: Degree of sedimentation of inorganic filler
*2: Degree of viscosity change

As can be seen in the results of Table 4 to 7 above, all the products of the present examples show no sedimentation of inorganic filler and exhibit a prolonged pot life and better storage stability as compared with the product of the conventional example. The resin compositions for semiconductor encapsulation of the present examples exhibit an excellent dischargeability and coatability. The semiconductor devices produced from the resin compositions for semiconductor encapsulation of the present examples exhibit a good reliability in humidity resistance. In particular, the products of Examples a1 to a 9 comprise a polyfunctional solid phenolic resin as a solid phenolic resin and thus exhibit a higher glass transition temperature than those comprising a solid phenolic resin which is not a polyfunctional solid phenolic resin. Further, the products of Examples a1 and a3 to a12 comprise a specific microcapsule type curing accelerator as a latent curing accelerator and thus exhibit a prolonged pot life and hence is excellent particularly in storage stability as compared with those comprising a commercially available microcapsule type curing accelerator.

On the contrary, the product of Comparative Example a1 comprises a liquid epoxy resin and a liquid phenolic resin and thus exhibits a deteriorated storage stability that causes the sedimentation of inorganic filler. Further, the product of Comparative Example a2 exhibits a viscosity of less than 7,000 poise at a temperature of 25° C. and thus is liable to sedimentation of inorganic filler. Moreover, the product of Comparative Example a3 comprises a curing accelerator which is not a latent curing accelerator and thus exhibits a reduced pot life and hence an increased viscosity change during storage. Finally, the resin composition for semiconductor encapsulation of Comparative Example a4 exhibits a viscosity of more than 5,000 poise at a temperature of 80° C. and hence a deteriorated dischargeability and coatability.

The present invention will be further described in the following examples of process for the production of the foregoing semiconductor devices.

EXAMPLE a13

The resin composition for semiconductor encapsulation prepared in Example a4 was previously defoamed at a temperature of 70° C. in vacuo. The resin composition thus defoamed was then used to produce a semiconductor device. In some detail, the resin composition for semiconductor encapsulation which had been heated to a temperature of 70° C. was applied to a wiring circuit board which had previously been heated to a temperature of 100° C. through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a14

A semiconductor device was produced by flip chip mounting in the same manner as in Example a13 except that the resin composition for semiconductor encapsulation of Example a5 which had been previously defoamed at a temperature of 70° C. in vacuo was used.

EXAMPLE a15

The resin composition for semiconductor encapsulation prepared in Example a9 was previously defoamed at a temperature of 70° C. in vacuo. A semiconductor device was then produced from the resin composition thus defoamed as follows. In some detail, a wiring circuit board having semiconductor elements mounted thereon wherein the two components are electrically connected to each other with a bonding wire was prepared. The resin composition for semiconductor encapsulation which had been heated to a temperature of 70° C. was then applied to the wiring circuit board and semiconductor elements which had previously been heated to a temperature of 70° C. at a pressure of 5 Torr by printing through an opening in the mask. Subsequently, the pressure of the atmosphere was raised to 150 Torr to remove voids contained in the resin composition for semiconductor encapsulation thus applied. The resin composition for semiconductor encapsulation which had been heated to a temperature of 70° C. was then used to finish printing with the pressure of the atmosphere being kept to 150 Torr. Thereafter, the resin composition for semiconductor encapsulation was thermoset at a temperature of 150° C. for 3 hours to form an encapsulating resin layer in such an arrangement that the semiconductor elements are encapsulated. In this manner, a cavity fill type of semiconductor device was produced.

EXAMPLE a16

A semiconductor device was produced by flip chip mounting in the same manner as in Example a13 except that the resin composition for semiconductor encapsulation of Example a10 which had been previously defoamed at a temperature of 70° C. in vacuo was used.

[Preparation of Resin Composition for Semiconductor Encapsulation α1]

The various components were mixed in proportions set forth in Table 8 below, melt-kneaded in a universal agitator, and then defoamed at a temperature of 70° C. in vacuo. The mixture was then cooled to room temperature to prepare a desired resin composition for semiconductor encapsulation. The kneading conditions were as follows. In some detail, the epoxy resin and the phenolic resin were charged into the universal agitator where they were then stirred at a temperature of 150° C. for 2 minutes so that all the solid content was dissolved. Subsequently, the temperature in the universal agitator was lowered to a range of from 90° C. to 100° C., and the mixture was then mixed with the inorganic filler for 10 minutes. Subsequently, the temperature in the universal agitator was adjusted to 75° C., and the mixture was then mixed with the curing accelerator for 2 minutes for use.

The resin composition for semiconductor encapsulation α1 thus obtained was then measured for viscosity at 25° C. and 80° C. by means of an E type viscometer in accordance with the methods previously mentioned. The resin composition for semiconductor encapsulation α1 was then measured and evaluated for glass transition temperature (Tg), storage stability (degree of sedimentation of inorganic filler, degree of change of viscosity), dischargeability, coatability and pot life in accordance with the methods previously mentioned. The semiconductor device produced from the foregoing resin composition for semiconductor encapsulation was then measured and evaluated for reliability in humidity resistance in accordance with the method previously mentioned. The results are set forth in Table 8 below.

TABLE 8

| | | Resin composition for semiconductor encapsulation α1 |
|---|---|---|
| Epoxy resin | aa1 | 414 |
| Phenolic resin | ba2 | 93 |
| | ba3 | 93 |
| Curing accelerator | c1 | 21.6 |
| Inorganic filler | d3 | 900 |
| Content of inorganic filler in total amount (wt %) | | 59 |
| Properties at 25° C. | | Semi-solid |
| Viscosity (poise) | 25° C. | 51,000 |
| | 80° C. | 17 |
| Glass transition temperature (° C.) | | 133 |
| Storage stability | *1 | ⊚ |
| | *2 | ⊚ |
| Dischargeability and coatability | | ⊚ |
| Pot life | | ⊚ |
| Reliability in humidity resistance (PCT) | | 200< |

*1: Degree of sedimentation of inorganic filler
*2: Degree of viscosity change

EXAMPLE a17

A semiconductor device was produced from the resin composition for semiconductor encapsulation α1 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 100° C. was filled with the resin composition for semiconductor encapsulation α1 which had been previously heated to a temperature of 70° C. through a dispenser. Thereafter, the resin composition for semiconductor encapsulation α1 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE a18

A semiconductor device was produced from the resin composition for semiconductor encapsulation α1 as follows. In some detail, a wiring circuit board having semi conductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α1 which had been previously heated to a temperature of 70° C. at a pressure of 5 Torr through a dispenser. Thereafter, the resin composition for semiconductor encapsulation α1 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE a19

A semiconductor device was produced from the resin composition for semiconductor encapsulation α1 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α1 which had been previously heated at a pressure of 5 Torr to a temperature of 70° C. through a dispenser. Thereafter, the pressure was returned to atmospheric pressure. The gap between the wiring circuit board and the semiconductor elements was then filled with the resin composition for semiconductor encapsulation α1 which had been heated to a temperature of 70° C. (differential pressure filling). The resin composition for semiconductor encapsulation α1 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE a20

A semiconductor device was produced from the resin composition for semiconductor encapsulation α1 as follows. In some detail, the resin composition for semiconductor encapsulation α1 which had been heated to a temperature of 70° C. was applied to a wiring circuit board which had previously been heated to a temperature of 100° C. through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a21

A semiconductor device was produced from the resin composition for semiconductor encapsulation α1 as follows. In some detail, the resin composition for semiconductor encapsulation α1 which had been heated to a temperature of 70° C. was applied to semiconductor elements which had previously been heated to a temperature of 100° C. through a dispenser so that the semiconductor elements were potted. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a22

A semiconductor device was produced from the resin composition for semiconductor encapsulation α1 as follows. In some detail, the resin composition for semiconductor encapsulation α1 which had been heated to a temperature of 70° C. was applied to a wiring circuit board which had previously been heated to a temperature of 70° C. at a pressure of 5 Torr through a dispenser so that the wiring circuit board was potted.

Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a23

A semiconductor device was produced from the resin composition for semiconductor encapsulation α1 as follows. In some detail, the resin composition for semiconductor encapsulation α1 which had been heated to a temperature of 70° C. was applied to semiconductor elements which had been previously heated to a temperature of 70° C. at a pressure of 5 Torr through a dispenser so that the semiconductor elements were potted. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a24

A semiconductor device was produced from the resin composition for semiconductor encapsulation α1 as follows. In some detail, the resin composition for semiconductor encapsulation α1 which had been heated to a temperature of 70° C. was applied to semiconductor elements which had previously been heated to a temperature of 70° C. by printing through an opening in the mask. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a25

A semiconductor device was produced from the resin composition for semiconductor encapsulation α1 as follows. In some detail, the resin composition for semiconductor encapsulation α1 which had been heated to a temperature of 70° C. was applied to a wiring circuit board which had previously been heated to a temperature of 70° C. by printing through an opening in the mask. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a26

A semiconductor device was produced from the resin composition for semiconductor encapsulation α1 as follows. In some detail, the resin composition for semiconductor encapsulation α1 which had been heated to a temperature of 70° C. was applied to semiconductor elements which had previously been heated to a temperature of 70° C. by printing through an opening in the mask at a pressure of 5 Torr. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a27

A semiconductor device was produced from the resin composition for semiconductor encapsulation α1 as follows. In some detail, the resin composition for semiconductor encapsulation α1 which had been heated to a temperature of 70° C. was applied to a wiring circuit board which had previously been heated to a temperature of 70° C. by printing through an opening in the mask at a pressure of 5 Torr. Thereafter, using a flip chip bonder, semiconductor elements which had been heated to a temperature of 70° C. were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE a28

A semiconductor device was produced from the resin composition for semiconductor encapsulation α1 as follows. In some detail, a wiring circuit board having semiconductor elements mounted thereon wherein they are electrically connected to each other with a bonding wire was prepared. The resin composition for semiconductor encapsulation α1 which had been heated to a temperature of 70° C. was then applied to the semiconductor elements which had been previously heated to a temperature of 100° C. through a dispenser so that the semiconductor elements were potted. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE a29

A semiconductor device was produced from the resin composition for semiconductor encapsulation α1 as follows. In some detail, a wiring circuit board having semiconductor elements mounted thereon wherein they are electrically connected to each other with a bonding wire was prepared. The resin composition for semiconductor encapsulation α1 which had been heated to a temperature of 70° C. was then applied to the semiconductor elements which had been previously heated to a temperature of 70° C. through a dispenser at a pressure of 5 Torr so that the semiconductor elements were potted. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE a30

A semiconductor device was produced from the resin composition for semiconductor encapsulation α1 as follows. In some detail, a wiring circuit board having semiconductor elements mounted thereon wherein they are electrically connected to each other with a bonding wire was prepared. The resin composition for semiconductor encapsulation α1 which had been heated to a temperature of 70° C. was then applied to the semiconductor elements which had been previously heated to a temperature of 70° C. by printing through an opening in the mask. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE a31

A semiconductor device was produced from the resin composition for semiconductor encapsulation α1 as follows. In some detail, a wiring circuit board having semiconductor elements mounted thereon wherein they are electrically connected to each other with a bonding wire was prepared. The resin composition for semiconductor encapsulation α1 which had been heated to a temperature of 70° C. was then applied to the semiconductor elements which had been previously heated to a temperature of 70° C. by printing through an opening in the mask at a pressure of 5 Torr. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE a32

A semiconductor device was produced from the resin composition for semiconductor encapsulation α1 as follows. In some detail, a wiring circuit board having semiconductor elements mounted thereon wherein they are electrically connected to each other with a bonding wire was prepared. The resin composition for semiconductor encapsulation α1 which had been heated to a temperature of 70° C. was then applied to the semiconductor elements which had been previously heated to a temperature of 70° C. by printing through an opening in the mask at a pressure of 5 Torr. Subsequently, the pressure of the atmosphere was raised to 150 Torr to remove voids contained in the resin composition for semiconductor encapsulation α1 thus applied. The resin composition for semiconductor encapsulation α1 which had been heated to a temperature of 70° C. was then used to finish printing with the pressure of the atmosphere being kept to 150 Torr. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE a33

The semiconductor device produced in Example a20 was placed on a mounting board (mother board), electrically connected to the mounting board, and then heated to a temperature of 100° C. Thereafter, the gap between the mounting board and the semiconductor device was filled with the resin composition for semiconductor encapsulation α1 which had been heated to a temperature of 70° C. through a dispenser. The resin composition thus applied was then thermoset at a temperature of 150° C. for 3 hours to form an encapsulating resin layer in the gap between the semiconductor device and the mounting board. In this manner, a semiconductor product was produced.

The various semiconductor devices thus obtained and the foregoing product having a semiconductor device mounted on a mounting board were each visually examined for presence of bubbles in the encapsulating resin layer. The results are set forth in Tables 9 to 11.

TABLE 9

| | Example No. | | | | | | | |
|---|---|---|---|---|---|---|---|---|
| | a13 | a14 | a15 | a16 | a17 | a18 | a19 | a20 | a21 |
| Presence of bubbles | Small amount | Small amount | Small amount | Small amount | Small amount | None | None | Small amount | Small amount |

TABLE 10

| | Example No. | | | | | | | |
|---|---|---|---|---|---|---|---|---|
| | a22 | a23 | a24 | a25 | a26 | a27 | a28 | a29 | a30 |
| Presence of bubbles | None | None | Small amount | Small amount | None | None | Yes | Small amount | Yes |

TABLE 11

| | Example No. | | |
|---|---|---|---|
| | a31 | a32 | a33 |
| Presence of bubbles | Small amount | None | Small amount |

As can be seen in the results of Tables 9 to 11, all the semiconductor devices except those of Examples a28 and a30 were observed to have no or a small amount of bubbles present in the encapsulating resin layer.

(2) Examples and comparative examples of the second embodiment of the resin composition for semiconductor encapsulation (combination of a solid epoxy resin and a liquid phenolic resin) will be described hereinafter.

The following various components were prepared prior to these examples.

[Epoxy Resin ab1]

Tetrafunctional naphthalene type epoxy resin represented by the following structural formula (ab1) (EXA-4701, produced by DAINIPPON INK & CHEMICALS, INC.; solid at 25° C.; epoxy equivalent: 167 g/eq; softening point: 68° C.)

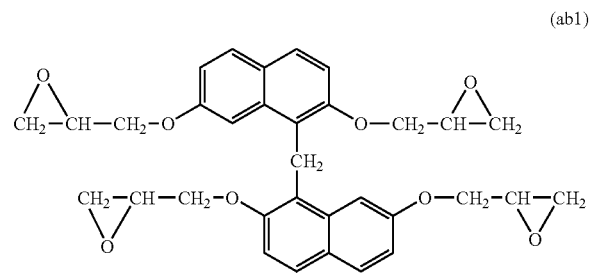

(ab1)

[Epoxy Resin ab2]

Triphenylmethane type epoxy resin represented by the following chemical formula (ab2) (EPPN-501HY, produced-byNIPPON KAYAKU CO., LTD.; solid at 25° C.; epoxy equivalent: 170 g/eq; softening point: 62° C.)

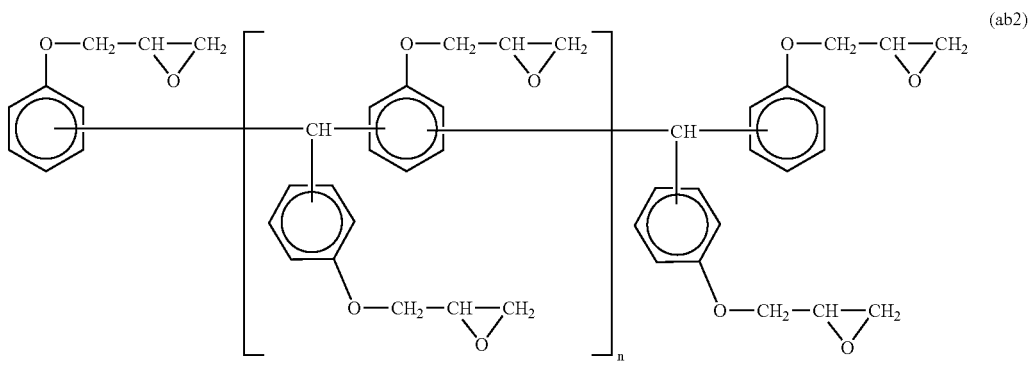

wherein n represents a number of about 1.8.

[Epoxy Resin ab3]

Solid epoxy resin represented by the following structural formula (ab3) (GK-4292, produced by Nippon Steel Chemical Co., Ltd.; solid at 25° C.; epoxy equivalent: 247 g/eq; melting point: 121° C.)

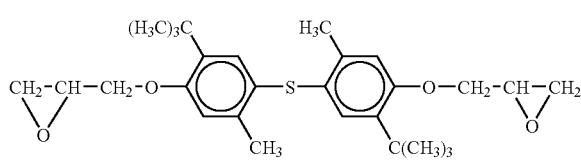

[Epoxy Resin ab4]

Solid epoxy resin represented by the following structural formula (ab4) (GK-4137, produced by Nippon Steel Chemical Co., Ltd.; solid at 25° C.; epoxy equivalent: 174 g/eq; melting point: 79° C.)

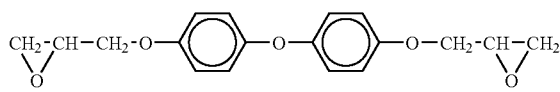

[Epoxy Resin ab5]

Bisphenol F type epoxy resin (Epo Tohto YDF-8170, produced by Tohto Kasei Corp.; liquid at 25° C. (13 poise); epoxy equivalent: 158 g/eq)

[Epoxy Resin ab6]

Solid epoxy resin represented by the following structural formula (ab6) (GK-5079, produced by Nippon Steel Chemical Co., Ltd.; solid at 25° C.; epoxy equivalent: 190 g/eq)

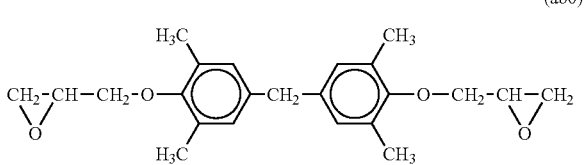

[Epoxy Resin ab7]

Triglycidyl isocyanurate (TEPIC-S, produced by Nissan Chemical Industries, Ltd.; solid at 25° C.; epoxy equivalent: 100 g/eq)

[Phenolic Resin bb1]

Allylated phenol novolak (MEH-8005H, produced by Showa Kasei Co., Ltd.; liquid at 25° C.; hydroxyl equivalent: 135 g/eq)

[Phenolic Resin bb2]

Diallylated bisphenol A (produced by Gunei Chemical Industry Co., Ltd.; liquid at 25° C.; hydroxyl equivalent: 154 g/eq)

[Curing accelerator c1]

The same microcapsule type curing accelerator as the curing accelerator c1 used in the examples and comparative examples of the first embodiment was used. The average particle diameter of the microcapsule type curing accelerator was 2 μm. The ratio of the shell thickness to the particle diameter of microcapsules was 15%. The encapsulated amount of triphenylphosphine was 30% by weight based on the total amount of the microcapsule type curing accelerator.

[Curing Accelerator c2]

MCE-9957 produced by NIPPON KAYAKU CO., LTD.

[Curing Accelerator c3]

2-Ethyl-4-methylimidazole (Curezol 2E4MZ, produced by Shikoku Chemicals Corp.)

[Inorganic Filler d1]

Spherical fused silica powder (SP-4B, produced by TONEN CHEMICAL CORPORATION; average particle diameter: 5.0 μM)

[Inorganic Filler d2]

Spherical fused silica powder (FB-48X, produced by DENKI KAGAKU KOGYO K. K.; average particle diameter: 15 μm)

[Inorganic Filler d3]

Spherical fused silica powder (SE-2100, produced by Admatechs Co., Ltd.; average particle diameter: 0.56 μm)

EXAMPLES b1–b10; COMPARATIVE EXAMPLES b1–b4

The foregoing various components were mixed in proportions set forth in Tables 12 to 14 below, and then kneaded in a universal agitator so that they were melt-mixed. Subsequently, the mixture was cooled to room temperature to prepare the desired resin compositions for semiconductor encapsulation. The kneading conditions were as follows.

EXAMPLES b1–b4; COMPARATIVE EXAMPLES b3, b4

The epoxy resin and the phenolic resin were charged into the universal agitator where they were stirred at a temperature of 110° C. for 5 minutes to dissolve all the solid contents. Subsequently, the temperature of the solution was lowered to a range of from 90° C. to 100° C. To the solution was then added the inorganic filler. The mixture was then stirred for 10 minutes. The mixture was then adjusted to a temperature of 65° C. To the mixture was then added the curing accelerator. The mixture was then stirred for 2 minutes for use.

EXAMPLES b5–b7; COMPARATIVE EXAMPLE b2

The epoxy resin and the phenolic resin were charged into the universal agitator where they were stirred at a temperature of 130° C. for 10 minutes to dissolve all the solid contents. Subsequently, the temperature of the solution was lowered to a range of from 90° C. to 100° C. To the solution was then added the inorganic filler. The mixture was then stirred for 10 minutes. The mixture was then adjusted to a temperature of 75° C. To the mixture was then added the curing accelerator. The mixture was then stirred for 2 minutes for use.

EXAMPLES b8–b10

The epoxy resin and the phenolic resin were charged into the universal agitator where they were stirred at a temperature of 150° C. for 10 minutes. Subsequently, the temperature of the solution was lowered to a range of from 90° C. to 100° C. To the solution was then added the inorganic filler. The mixture was then stirred for 10 minutes. The mixture was then adjusted to a temperature of 65° C. To the mixture was then added the curing accelerator. The mixture was then stirred for 2 minutes for use.

COMPARATIVE EXAMPLE b1

The epoxy resin and the phenolic resin were charged into the universal agitator where they were stirred at a temperature of 80° C. for 10 minutes. Thereafter, to the solution was then added the inorganic filler at the same temperature. The mixture was then stirred for 10 minutes. The mixture was then adjusted to a temperature of 50° C. To the mixture was then added the curing accelerator. The mixture was then stirred for 2 minutes for use.

TABLE 12

(Unit: parts)

| | | b1 | b2 | b3 | b4 | b5 |
|---|---|---|---|---|---|---|
| Epoxy resin | ab1 | 325 | 325 | 332 | — | — |
| | ab2 | — | — | — | 328 | — |
| | ab3 | — | — | — | — | 380 |
| | ab4 | — | — | — | — | — |
| | ab5 | — | — | — | — | — |
| | ab6 | — | — | — | — | — |
| | ab7 | — | — | — | — | — |
| Phenolic resin | bb1 | 263 | 263 | 268 | 260 | 210 |
| | bb2 | — | — | — | — | — |
| Curing accelerator | c1 | 30.5 | — | 31.4 | 30.2 | 24.6 |
| | c2 | — | 46 | — | — | — |
| | c3 | — | — | — | — | — |
| Inorganic filler | d1 | 140 | 140 | 900 | 140 | 140 |
| | d2 | 742 | 742 | — | 742 | 742 |
| Content of inorganic filler in total amount (wt %) | | 59 | 58 | 59 | 59 | 59 |

TABLE 13

(Unit: parts)

| | | b6 | b7 | b8 | b9 | b10 |
|---|---|---|---|---|---|---|
| Epoxy resin | ab1 | — | — | — | — | — |
| | ab2 | — | — | — | — | — |
| | ab3 | 333 | 319 | — | — | — |
| | ab4 | — | — | 120 | 649 | 649 |
| | ab5 | — | — | — | — | — |
| | ab6 | — | — | 131 | — | — |
| | ab7 | — | — | — | — | — |
| Phenolic resin | bb1 | 184 | 176 | 94 | 504 | 504 |
| | bb2 | — | — | 106 | — | — |
| Curing accelerator | c1 | 21.5 | 20.6 | 23.4 | 58.9 | — |
| | c2 | — | — | — | — | 88.2 |
| | c3 | — | — | — | — | — |
| Inorganic filler | d1 | 152 | 159 | 166 | 45.4 | 45.4 |
| | d2 | 809 | 846 | 884 | 243 | 243 |
| Content of inorganic filler in total amount (wt %) | | 64 | 66 | 69 | 19 | 19 |

TABLE 14

(Unit: parts)

| | | Comparative Example No. | | | |
|---|---|---|---|---|---|
| | | b1 | b2 | b3 | b4 |
| Epoxy resin | ab1 | — | — | — | — |
| | ab2 | — | — | 328 | — |
| | ab3 | — | 290 | — | — |
| | ab4 | — | — | — | — |
| | ab5 | 239 | — | — | — |
| | ab6 | — | — | — | — |
| | ab7 | — | — | — | 569 |
| Phenolic resin | bb1 | 204 | 160 | 260 | 569 |
| | bb2 | — | — | — | — |
| Curing accelerator | c1 | 23.8 | 18.7 | — | 66.6 |
| | c2 | — | — | — | — |
| | c3 | — | — | 5.2 | — |
| Inorganic filler | d1 | 164 | 166 | 140 | 45 |
| | d2 | 869 | 884 | 742 | 240 |

TABLE 14-continued (Unit: parts)

| | Comparative Example No. | | | |
|---|---|---|---|---|
| | b1 | b2 | b3 | b4 |
| Content of inorganic filler in total amount (wt %) | 69 | 69 | 60 | 19 |

The resin compositions for semiconductor encapsulation of examples and comparative examples thus obtained were each measured for viscosity at 25° C. and 80° C. by means of an E type viscometer in accordance with the foregoing methods. These resin compositions for semiconductor encapsulation were each then measured and evaluated for glass transition temperature (Tg), storage stability (degree of sedimentation of inorganic filler, degree of change of viscosity), dischargeability, coatability and pot life in accordance with the following methods. The semiconductor devices produced from the foregoing resin compositions for semiconductor encapsulation were then measured and evaluated for reliability in humidity resistance in accordance with the following method. The results are set forth in Tables 15 to 17 below.

[Glass Transition Temperature (Tg)]

The glass transition temperature was determined in the same manner as in the first embodiment.

[Storage Stability]

*1: Degree of Sedimentation of Inorganic Filler

The degree of sedimentation of inorganic filler was determined in the same manner as in the first embodiment.

*2: Degree of Viscosity Change

The degree of viscosity change was determined in the same manner as in the first embodiment.

[Dischargeability, Coatability]

The dischargeability and coatability were determined in the same manner as in the first embodiment.

[Pot Life (Viscosity Change)]

The pot life was determined in the same manner as in the first embodiment.

[Reliability in Humidity Resistance]

The reliability in humidity resistance was determined in the same manner as in the first embodiment.

TABLE 15

| | Example No. | | | | |
|---|---|---|---|---|---|
| | b1 | b2 | b3 | b4 | b5 |
| Properties at 25° C. | Semi-solid | Semi-solid | Semi-solid | Semi-solid | Solid |
| Viscosity 25° C. | 267000 | 250000 | >300000 | >300000 | Solid |
| (poise) 80° C. | 128 | 120 | 235 | 143 | 3000 |
| Glass transition temp. (° C.) | 118 | 119 | 118 | 119 | 86 |
| Storage stability *1 | ◎ | ◎ | ◎ | ◎ | ◎ |
| *2 | ◎ | ○ | ◎ | ◎ | ◎ |
| Dischargeability, coatability | ◎ | ◎ | ◎ | ◎ | ○ |
| Pot life | ◎ | ○ | ◎ | ◎ | ◎ |
| Reliability in humidity resistance (PCT) | 200< | 200< | 200< | 200< | 140 |

*1: Degree of sedimentation of inorganic filler
*2: Degree of viscosity change

TABLE 16

| | Example No. | | | | |
|---|---|---|---|---|---|
| | b6 | b7 | b8 | b9 | b10 |
| Properties at 25° C. | Semi-solid | Semi-solid | Semi-solid | Semi-solid | Solid |
| Viscosity 25° C. | Solid | Solid | 7500 | Solid | Solid |
| (poise) 80° C. | 3510 | 4500 | 20 | 15 | 16 |
| Glass transition temp. (° C.) | 87 | 88 | 71 | 65 | 66 |
| Storage stability *1 | ◎ | ◎ | ◎ | ◎ | ◎ |
| *2 | ◎ | ◎ | ◎ | ◎ | ○ |
| Dischargeability, coatability | ○ | Δ | ◎ | ◎ | ◎ |
| Pot life | ◎ | ◎ | ◎ | ◎ | ○ |
| Reliability in humidity resistance (PCT) | 140 | 150 | 150 | 60 | 60 |

*1: Degree of sedimentation of inorganic filler
*2: Degree of viscosity change

TABLE 17

| | Comparative Example No. | | | |
|---|---|---|---|---|
| | b1 | b2 | b3 | b4 |
| Properties at 25° C. | Liquid | Solid | Semi-solid | Liquid |
| Viscosity 25° C. | 5700 | Solid | >300000 | 6500 |
| (poise) 80° C. | 15 | 5600 | 250 | 15 |
| Glass transition temp. (° C.) | 59 | 87 | 137 | *3 |
| Storage stability *1 | X | ◎ | ◎ | X |
| *2 | ◎ | ◎ | X | ○ |
| Dischargeability, coatability | ◎ | X | ◎ | ◎ |
| Pot life | ◎ | ◎ | X | ○ |
| Reliability in humidity resistance (PCT) | 70 | 100 | 80 | *3 |

*1: Degree of sedimentation of inorganic filler
*2: Degree of viscosity change
*3: Uncured and immeasurable As can be seen in the results of Table 15 to 17 above, all the products of the present examples show no sedimentation of inorganic filler and exhibit a prolonged pot life and excellent storage stability. The resin compositions for semiconductor encapsulation of the present examples exhibit an excellent dischargeability and coatability. The semiconductor devices produced from the resin compositions for semiconductor encapsulation of the present examples exhibit a good reliability in humidity resistance. In particular, the products of Examples b1 to b4 comprise a polyfunctional solid epoxy resin as a solid epoxy resin and thus exhibit a higher glass transition temperature than those comprising a solid epoxy resin which is not a polyfunctional solid epoxy resin. Further, the products of Examples b1 and b3 to b9 comprise a specific microcapsule type curing accelerator as a latent curing accelerator and thus exhibit an extremely prolonged pot life and hence is excellent in storage stability as compared with those comprising a commercially available microcapsule type curing accelerator.

On the contrary, the products of Comparative Examples b1 and b4 are a liquid which exhibits a viscosity of less than 7,000 poise at 25° C. and thus exhibit a deteriorated storage stability that causes the sedimentation of inorganic filler. Further, the product of Comparative Example b2 exhibits a viscosity of more than 5,000 poise at a temperature of 80° C. and thus exhibits a deteriorated fluidity that causes the deterioration of dischargeability and coatability. Moreover, the product of Comparative Example b3 comprises a curing accelerator which is not a latent curing accelerator and thus exhibits a reduced pot life and hence a drastically increased viscosity change during storage.

The present invention will be further described in the following examples of process for the production of the foregoing semiconductor devices.

EXAMPLE b11

A semiconductor device was then produced from the resin composition for semiconductor encapsulation prepared in Example b1 as follows. In some detail, a wiring circuit board having semiconductor elements mounted thereon wherein the two components are electrically connected to each other with a bonding wire was prepared. The resin composition for semiconductor encapsulation which had been heated to a temperature of 70° C. was then applied to the wiring circuit board and semiconductor elements which had previously been heated to a temperature of 70° C. at a pressure of 5 Torr by printing through an opening in the mask. Subsequently, the pressure of the atmosphere was raised to 50 Torr to remove voids contained in the resin composition for semiconductor encapsulation thus applied. The resin composition for semiconductor encapsulation which had been heated to a temperature of 70° C. was then used to finish printing with the pressure of the atmosphere being kept to 50 Torr. Thereafter, the resin composition for semiconductor encapsulation thus applied was thermoset at a temperature of 150° C. for 3 hours to form an encapsulating resin layer in such an arrangement that the semiconductor elements are encapsulated. In this manner, a cavity fill type of semiconductor device was produced.

EXAMPLE b12

A semiconductor device was produced from the resin composition for semiconductor encapsulation prepared in Example b3 as follows. In some detail, the resin composition for semiconductor encapsulation which had been heated to a temperature of 70° C. was applied to a wiring circuit board which had previously been heated to a temperature of 70° C. through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b13

A semiconductor device was then produced from the resin composition for semiconductor encapsulation prepared in Example b4 as follows. In some detail, a wiring circuit board having semiconductor elements mounted thereon wherein the two components are electrically connected to each other with a bonding wire was prepared. The resin composition for semiconductor encapsulation which had been heated to a temperature of 70° C. was then applied to the wiring circuit board and semiconductor elements which had previously been heated to a temperature of 70° C. at a pressure of 5 Torr by printing through an opening in the mask. Subsequently, the pressure of the atmosphere was raised to 50 Torr to remove voids contained in the resin composition for semiconductor encapsulation thus applied. The resin composition for semiconductor encapsulation which had been heated to a temperature of 70° C. was then used to finish printing with the pressure of the atmosphere being kept to 50 Torr. Thereafter, the resin composition for semiconductor encapsulation thus applied was thermoset at a temperature of 150° C. for 3 hours to form an encapsulating resin layer in such an arrangement that the semiconductor elements are encapsulated. In this manner, a cavity fill type of semiconductor device was produced.

EXAMPLE b14

A semiconductor device was produced by flip chip mounting in the same manner as in Example b13 except that the resin composition for semiconductor encapsulation prepared in Example b8 was used.

[Preparation of Resin Composition for Semiconductor Encapsulation α2]

The various components were mixed in proportions set forth in Table 18 below, and then melt-kneaded in a universal agitator. The mixture was then cooled to room temperature to prepare a desired resin composition for semiconductor encapsulation. The kneading conditions were as follows. In some detail, the epoxy resin and the phenolic resin were charged into the universal agitator where they were then stirred at a temperature of 110° C. for 5 minutes so that all the solid content was dissolved. Subsequently, the temperature in the universal agitator was lowered to a range of from 90° C. to 100° C., and the mixture was then mixed with the inorganic filler for 10 minutes. Subsequently, the temperature in the universal agitator was adjusted to 65° C., and the mixture was then mixed with the curing accelerator for 2 minutes for use.

The resin composition for semiconductor encapsulation α2 thus obtained was then measured for viscosity at 25° C. and 80° C. by means of an E type viscometer in accordance with the methods previously mentioned. The resin composition for semiconductor encapsulation α2 was then measured and evaluated for glass transition temperature (Tg), storage stability (degree of sedimentation of inorganic filler, degree of change of viscosity) dischargeability, coatability and pot life in accordance with the methods previously mentioned. The semiconductor device produced from the foregoing resin composition for semiconductor encapsulation α2 was then measured and evaluated for reliability in humidity resistance in accordance with the method previously mentioned. The results are set forth in Table 18 below.

TABLE 18

|  |  | Resin composition for semiconductor encapsulation α2 |
| --- | --- | --- |
| Epoxy resin | ab1 | 325 |
| Phenolic resin | bb1 | 263 |
| Curing accelerator | c1 | 30.5 |
| Inorganic filler | d3 | 882 |
| Content of inorganic filler in total amount (wt %) |  | 59 |
| Properties at 25° C. |  | Semi-solid |
| Viscosity (poise) | 25° C. | 150,000 |
|  | 80° C. | 60 |
| Glass transition temperature (° C.) |  | 121 |
| Storage stability | *1 | ⊚ |
|  | *2 | ⊚ |
| Dischargeability and coatability |  | ⊚ |
| Pot life |  | ⊚ |
| Reliability in humidity resistance (PCT) |  | 200< |

*1: Degree of sedimentation of inorganic filler
*2: Degree of viscosity change

EXAMPLE b15

A semiconductor device was produced from the resin composition for semiconductor encapsulation α2 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α2 which had been previously heated to a temperature of 70° C. through a dispenser. Thereafter, the resin composition for semiconductor encapsulation α2 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE b16

A semiconductor device was produced using the resin composition for semiconductor encapsulation α2 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α2 which had been previously heated to a temperature of 70° C. at a pressure of 5 Torr through a dispenser. Thereafter, the resin composition for semiconductor encapsulation α2 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE b17

A semiconductor device was produced using the resin composition for semiconductor encapsulation α2 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α2 which had been previously heated at a pressure of 5 Torr to a temperature of 70° C. through a dispenser. Thereafter, the pressure was returned to atmospheric pressure. The gap between the wiring circuit board and the semiconductor elements was then filled with the resin composition for semiconductor encapsulation α2 which had been heated to a temperature of 70° C. (differential pressure filling). The resin composition for semiconductor encapsulation α2 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE b18

A semiconductor device was produced using the resin composition for semiconductor encapsulation α2 as follows. In some detail, the resin composition for semiconductor encapsulation α2 which had been heated to a temperature of 70° C. was applied to a wiring circuit board which had previously been heated to a temperature of 70° C. through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b19

A semiconductor device was produced using the resin composition for semiconductor encapsulation α2 as follows. In some detail, the resin composition for semiconductor encapsulation α2 which had been heated to a temperature of 70° C. was applied to semiconductor elements which had previously been heated to a temperature of 90° C. through a dispenser so that the semiconductor elements were potted. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b20

A semiconductor device was produced using the resin composition for semiconductor encapsulation α2 as follows. In some detail, the resin composition for semiconductor encapsulation α2 which had been heated to a temperature of 70° C. was applied to a wiring circuit board which had previously been heated to a temperature of 70° C. at a pressure of 5 Torr through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b21

A semiconductor device was produced using the resin composition for semiconductor encapsulation α2 as follows. In some detail, the resin composition for semiconductor encapsulation α1 which had been heated to a temperature of 70° C. was applied to semiconductor elements which had been previously heated to a temperature of 90° C. at a pressure of 5 Torr through a dispenser so that the semiconductor elements were potted. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b22

A semiconductor device was produced using the resin composition for semiconductor encapsulation α2 as follows. In some detail, the resin composition for semiconductor encapsulation α1 which had been heated to a temperature of 70° C. was applied to semiconductor elements which had previously been heated to a temperature of 90° C. by printing through an opening in the mask. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b23

A semiconductor device was produced using the resin composition for semiconductor encapsulation α2 as follows. In some detail, the resin composition for semiconductor encapsulation α2 which had been heated to a temperature of 70° C. was applied to a wiring circuit board which had previously been heated to a temperature of 70° C. by printing through an opening in the mask. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b24

A semiconductor device was produced using the resin composition for semiconductor encapsulation α2 as follows. In some detail, the resin composition for semiconductor encapsulation α2 which had been heated to a temperature of 70° C. was applied to semiconductor elements which had previously been heated to a temperature of 90° C. by printing through an opening in the mask at a pressure of 5 Torr. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b25

A semiconductor device was produced using the resin composition for semiconductor encapsulation α2 as follows. In some detail, the resin composition for semiconductor encapsulation α2 which had been heated to a temperature of 70° C. was applied to a wiring circuit board which had previously been heated to a temperature of 70° C. by printing through an opening in the mask at a pressure of 5 Torr. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE b26

A semiconductor device was produced using the resin composition for semiconductor encapsulation α2 as follows. In some detail, a wiring circuit board having semiconductor elements mounted thereon wherein they are electrically connected to each other with a bonding wire was prepared. The resin composition for semiconductor encapsulation α2 which had been heated to a temperature of 70° C. was then applied to the semiconductor elements which had been previously heated to a temperature of 70° C. through a dispenser so that the semiconductor elements were potted. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE b27

A semiconductor device was produced using the resin composition for semiconductor encapsulation α2 as follows. In some detail, a wiring circuit board having semi conductor elements mounted thereon wherein they are electrically connected to each other with a bonding wire was prepared. The resin composition for semiconductor encapsulation α2 which had been heated to a temperature of 70° C. was then applied to the semiconductor elements which had been previously heated to a temperature of 70° C. through a dispenser at a pressure of 5 Torr so that the semiconductor elements were potted. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE b28

A semiconductor device was produced using the resin composition for semiconductor encapsulation α2 as follows. In some detail, a wiring circuit board having semiconductor elements mounted thereon wherein they are electrically connected to each other with a bonding wire was prepared. The resin composition for semiconductor encapsulation α2 which had been heated to a temperature of 70° C. was then applied to the semiconductor elements which had been previously heated to a temperature of 70° C. by printing through an opening in the mask. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE b29

A semiconductor device was produced using the resin composition for semiconductor encapsulation α2 as follows. In some detail, a wiring circuit board having semiconductor elements mounted thereon wherein they are electrically connected to each other with a bonding wire was prepared. The resin composition for semiconductor encapsulation α2 which had been heated to a temperature of 70° C. was then applied to the semiconductor elements which had been previously heated to a temperature of 70° C. by printing through an opening in the mask at a pressure of 5 Torr. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE b30

A semiconductor device was produced using the resin composition for semiconductor encapsulation α2 as follows. In some detail, a wiring circuit board having semiconductor elements mounted thereon wherein they are electrically connected to each other with a bonding wire was prepared. The resin composition for semiconductor encapsulation α2 which had been heated to a temperature of 70° C. was then applied to the semiconductor elements which had been previously heated to a temperature of 70° C. by printing through an opening in the mask at a pressure of 5 Torr. Subsequently, the pressure of the atmosphere was raised to 50 Torr to remove voids contained in the resin composition for semiconductor encapsulation α2 thus applied. The resin composition for semiconductor encapsulation α2 which had been heated to a temperature of 70° C. was then used to finish printing with the pressure of the atmosphere being kept to 50 Torr. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE b31

The resin composition for semiconductor encapsulation α2 which had been heated to a temperature of 70° C. was applied to a mounting board (mother board) through a dispenser so that the mounting board was potted. The semiconductor device produced in Example b20 was placed on the mounting board. Using an IR reflow furnace (conditions: 240° C.×10 sec), the semiconductor device and the mounting board were then electrically connected to each other with connecting electrode portions, and at the same time, an encapsulating resin layer was formed in the gap between the semiconductor device and the mounting board. In this manner, a semiconductor product was produced.

The various semiconductor devices thus obtained and the foregoing product having a semiconductor device mounted on a mounting board were each visually examined for presence of bubbles in the encapsulating resin layer. The results are set forth in Tables 19 to 21.

TABLE 19

|  | Example No. | | | | | | | | |
| --- | --- | --- | --- | --- | --- | --- | --- | --- | --- |
|  | b11 | b12 | b13 | b14 | b15 | b16 | b17 | b18 | b191 |
| Presence of bubbles | Small amount | Small amount | Small amount | Small amount | Small amount | None | None | Small amount | Small amount |

TABLE 20

| | Example No. | | | | | | | |
|---|---|---|---|---|---|---|---|---|
| | b20 | b21 | b22 | b23 | b24 | b25 | b26 | b27 | b28 |
| Presence of bubbles | None | None | Small amount | Small amount | None | None | Yes | Small amount | Yes |

TABLE 21

| | Example No. | | |
|---|---|---|---|
| | b29 | b30 | b31 |
| Presence of bubbles | Small amount | None | Small amount |

As can be seen in the results of Tables 19 to 21, all the semiconductor devices or semiconductor products except those of Examples b26 and b28 were observed to have no or a small amount of bubbles present in the encapsulating resin layer.

(3) Examples and comparative examples of the third embodiment of the resin composition for semiconductor encapsulation (combination of a solid epoxy resin and a solid phenolic resin) will be described hereinafter.

The following various components were prepared prior to these examples.

[Epoxy Resin ac1]

Crystalline epoxy resin represented by the following chemical formula (ac1) (GK-4137, produced by Nippon Steel Chemical Co., Ltd.; solid at 25° C.; epoxy equivalent: 174 g/eq; melting point: 79° C.)

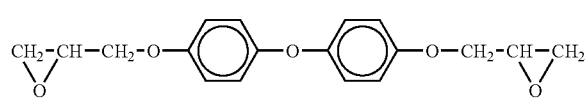
(ac1)

[Epoxy Resin ac2]

Crystalline epoxy resin represented by the following chemical formula (ac2) (YDC-1312, produced by Tohto Kasei Co., Ltd.; solid at 25° C.; epoxy equivalent: 173 g/eq; melting point: 145° C.)

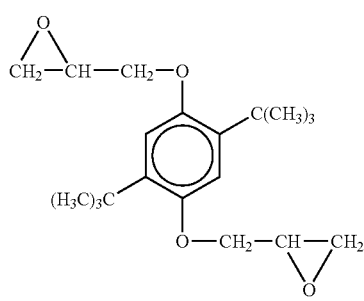
(ac2)

[Epoxy Resin ac3]

Crystalline epoxy resin represented by the following chemical formula (ac3) (YX-4000H, produced by Yuka Shell Co., Ltd.; solid at 25° C.; epoxy equivalent: 195 g/eq; melting point: 105° C.)

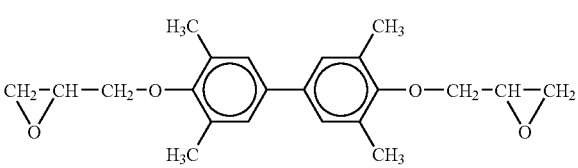
(ac3)

[Epoxy Resin ac4]

Solid epoxy resin represented by the following structural formula (ab4) (GK-5079, produced by Nippon Steel Chemical Co., Ltd.; solid at 25° C.; epoxy equivalent: 190 g/eq; melting point: 78° C.)

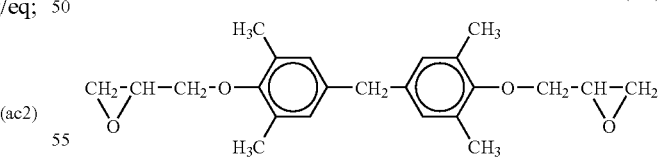
(ac4)

[Epoxy Resin ac5]

Triphenylmethane type epoxy resin represented by the following chemical formula (ac5) (EPPN-501HY, produced-byNIPPON KAYAKU CO., LTD.; solid at 25° C.; epoxy equivalent: 170 g/eq; softening point: 62° C.)

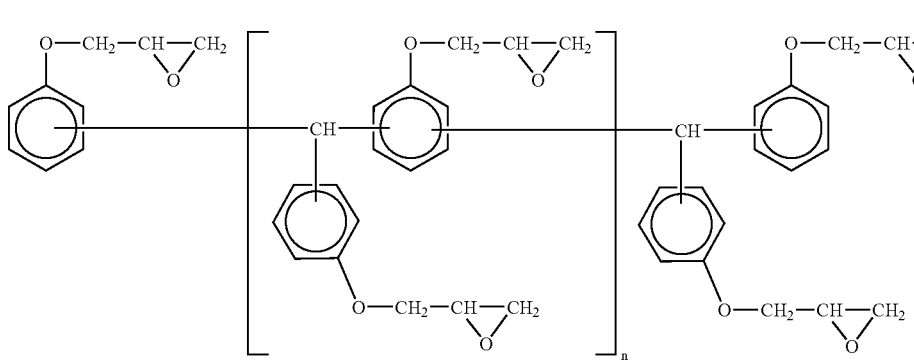
(ac5)

wherein n represents a number of about 1.8.

[Epoxy Resin ac6]
Bisphenol F type epoxy resin (Epo Tohto YDF-8170, produced by Tohto Kasei Co., Ltd.; liquid at 25° C.; epoxy equivalent: 158 g/eq)

[Epoxy Resin ac7]
Bisphenol A type epoxy resin (DER-332, produced by The Dow Chemical Company; liquid at 25° C.; epoxy equivalent: 170 g/eq)

[Epoxy Resin ac8]
Tetrafunctional naphthalene type epoxy resin represented by the following structural formula (ac8) (EXA-4701, produced by DAINIPPON INK & CHEMICALS, INC.; solid at 25° C.; epoxy equivalent: 167 g/eq; softening point: 68° C.)

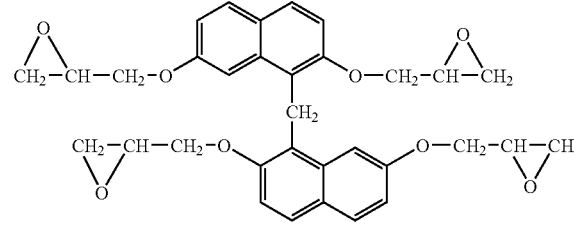
(ac8)

[Phenolic Resin bc1]
p-Ethylphenol resin represented by the following chemical formula (bc1) (produced by Meiwa Kasei Co., Ltd.; solid at 25° C.; hydroxyl equivalent: 129 g/eq; melting point: 98° C.)

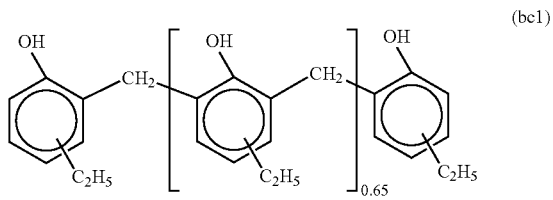
(bc1)

[Phenolic Resin bc2]
A mixture of a trifunctional phenolic resin represented by the following chemical formula (bc2') and a tetrafunctional phenolic resin represented by the following chemical formula (bc2") [MHD-244HG, produced by Honshu Chemical Industry Co., Ltd.; melting point: 140° C.]. The peak area ratio of the resin represented by the chemical formula (bc2') and the resin represented by the chemical formula (bc2") (to all peak area) are about 84% and about 15%, respectively, as analyzed by liquid chromatography.

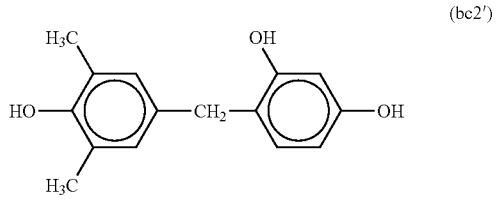
(bc2')

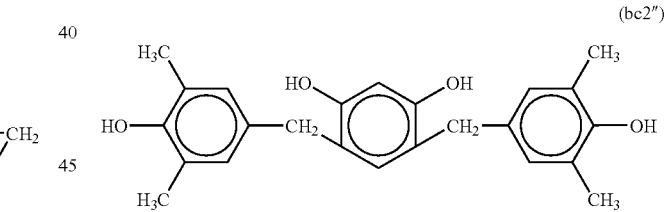
(bc2")

[Phenolic Resin bc3]
A mixture of the tetrafunctional phenolic resin represented by the chemical formula (bc2") and the trifunctional phenolic resin represented by the following chemical formula (bc2') [Bis26X-RS, produced by Honshu Chemical Industry Co., Ltd.; melting point: 182° C.]. The peak area ratio of the resin represented by the chemical formula (bc2") and the resin represented by the chemical formula (bc2') (to all peak area) are about 90% and about 8%, respectively, as analyzed by liquid chromatography.

[Phenolic Resin bc4]
Trifunctional phenolic resin represented by the following chemical formula (ba4) (HDM-234, produced by Honshu Chemical Industry Co., Ltd.; solid at 25° C.; purity: 98%; melting point: 94° C.)

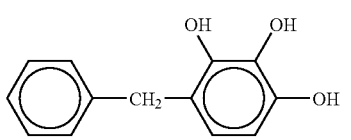

(bc4)

[Phenolic Resin bc5]
Phenolic resin represented by the following chemical formula (bc5) (BPF-ST, produced by Mitsui Chemical Inc.; solid at 25° C.)

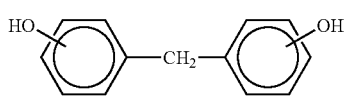

(bc5)

[Phenolic Resin bc6]
Allylated phenol novolak (MEH-8005H, produced by Meiwa Kasei Co., Ltd.; liquid at 25 C.; hydroxyl equivalent: 135 g/eq)

[Curing Accelerator c1]
The same microcapsule type curing accelerator as the curing accelerator c1 used in the examples and comparative examples of the first embodiment was used. The average particle diameter of the microcapsule type curing accelerator was 2 μm. The ratio of the shell thickness to the particle diameter of microcapsules was 15%. The encapsulated amount of triphenylphosphine was 30% by weight based on the total amount of the microcapsule type curing accelerator.

[Curing Accelerator c2]
MCE-9957 produced by NIPPON KAYAKU CO., LTD.
[curing accelerator c3]
2-Ethyl-4-methylimidazole (Curezol 2E4MZ, produced by Shikoku Chemicals Corp.)

[Inorganic Filler d1]
Spherical fused silica powder (SP-4B, produced by TONEN CHEMICAL CORPORATION; average particle diameter: 5.0 μm)

[Inorganic Filler d2]
Spherical fused silica powder (FB-48X, produced by DENKI KAGAKU KOGYO K. K.; average particle diameter: 15 μm)

[Inorganic Filler d3]
Spherical fused silica powder (SE-2100, produced by Admatechs Co., Ltd.; average particle diameter: 0.56 μm)

EXAMPLES c1–c11; COMPARATIVE EXAMPLES c1–c4

The foregoing various components were mixed in proportions set forth in Tables 22 to 24 below, and then kneaded in a universal agitator so that they were melt-mixed. Subsequently, the mixture was cooled to room temperature to prepare the desired resin compositions for semiconductor encapsulation. The kneading conditions were as follows.

EXAMPLES c1–c11; COMPARATIVE EXAMPLES c2–c4

The epoxy resin and the phenolic resin were charged into the universal agitator where they were stirred at a temperature of 150° C. for 10 minutes to dissolve all the solid contents. Subsequently, the temperature of the solution was lowered to a range of from 90° C. to 100° C. To the solution was then added the inorganic filler. The mixture was then stirred for 10 minutes. The mixture was then adjusted to a temperature of 75° C. To the mixture was then added the curing accelerator. The mixture was then stirred for 2 minutes for use. However, in Comparative Example 4, the mixture was adjusted to a temperature of 65° C., followed by the addition of the curing accelerator.

COMPARATIVE EXAMPLE c1

The epoxy resin and the phenolic resin were charged into the universal agitator where they were stirred at a temperature of 80° C. for 10 minutes. Thereafter, to the mixture was added the inorganic filler at the same temperature. The mixture was then stirred for 10 minutes. The temperature of the solution was lowered to 50° C. To the solution was then added the inorganic filler. The mixture was then stirred for 2 minutes.

TABLE 22

(Unit: parts)

| | | Example No. | | | | |
|---|---|---|---|---|---|---|
| | | c1 | c2 | c3 | c4 | c5 |
| Epoxy resin | ac1 | 391 | 391 | 309 | 376 | — |
| | ac2 | — | — | — | — | 133 |
| | ac3 | — | — | — | — | 150 |
| | ac4 | — | — | — | — | 145 |
| | ac5 | — | — | — | — | — |
| | ac6 | — | — | — | — | — |
| | ac7 | — | — | — | — | — |
| Phenolic resin | bc1 | — | — | — | — | — |
| | bc2 | 99.7 | 99.7 | 150 | 182 | — |
| | bc3 | 99.7 | 99.7 | 141 | 171 | — |
| | bc4 | — | — | — | — | 164 |
| | bc5 | — | — | — | — | — |
| | bc6 | — | — | — | — | — |
| Curing accelerator | c1 | 23.1 | — | 34 | 41.2 | 19.1 |
| | c2 | — | 34.9 | — | — | — |
| | c3 | — | — | — | — | — |
| Inorganic filler | d1 | 140 | 140 | 900 | 729 | 141 |
| | d2 | 746 | 746 | — | — | 748 |
| Content of inorganic filler in total amount (wt %) | | 59 | 59 | 59 | 49 | 59 |

TABLE 23

(Unit: parts)

| | | Example No. | | | | | |
|---|---|---|---|---|---|---|---|
| | | c6 | c7 | c8 | c9 | c10 | c11 |
| Epoxy resin | ac1 | — | — | 663 | 663 | 210 | — |
| | ac2 | 134 | — | — | — | — | — |
| | ac3 | 151 | — | — | — | — | — |
| | ac4 | 147 | — | — | — | 229 | — |
| | ac5 | — | 379 | — | — | — | — |
| | ac6 | — | — | — | — | — | — |
| | ac7 | — | — | — | — | — | 210 |
| | ac8 | — | — | — | — | — | 163 |
| Phenolic resin | bc1 | — | — | 491 | 491 | 311 | — |
| | bc2 | — | — | — | — | — | — |
| | bc3 | — | — | — | — | — | — |
| | bc4 | 167 | — | — | — | — | 86.5 |

TABLE 23-continued (Unit: parts)

| | | Example No. | | | | | |
|---|---|---|---|---|---|---|---|
| | | c6 | c7 | c8 | c9 | c10 | c11 |
| | bc5 | — | 221 | — | — | — | — |
| | bc6 | — | — | — | — | — | 131 |
| Curing accelerator | c1 | 19.5 | 25.9 | 57.5 | — | 36.4 | 25.3 |
| | c2 | — | — | — | 85.9 | — | — |
| | c3 | — | — | — | — | — | — |
| Inorganic filler | d1 | 900 | 900 | 45.4 | 45.4 | 119 | 140 |
| | d2 | — | — | 243 | 243 | 631 | 747 |
| Content of inorganic filler in total amount (wt %) | | 59 | 59 | 19 | 19 | 49 | 59 |

TABLE 24

(Unit: parts)

| | | Comparative Example No. | | | |
|---|---|---|---|---|---|
| | | c1 | c2 | c3 | c4 |
| Epoxy resin | ac1 | — | 231 | 294 | — |
| | ac2 | — | — | — | — |
| | ac3 | — | — | — | — |
| | ac4 | — | — | — | — |
| | ac5 | — | 252 | — | 379 |
| | ac6 | 239 | — | — | — |
| Phenolic resin | bc1 | — | 342 | — | — |
| | bc2 | — | — | 142 | — |
| | bc3 | — | — | 134 | — |
| | bc4 | — | — | — | — |
| | bc5 | — | — | — | 221 |
| | bc6 | 204 | — | — | — |
| Curing accelerator | c1 | 23.8 | 40 | 32.3 | — |
| | c2 | — | — | — | — |
| | c3 | — | — | — | 4.4 |
| Inorganic filler | d1 | 164 | 107 | 147 | 900 |
| | d2 | 869 | 568 | 783 | — |
| Content of inorganic filler in total amount (wt %) | | 60 | 44 | 61 | 60 |

The resin compositions for semiconductor encapsulation of examples and comparative examples thus obtained were each measured for viscosity at 25° C. and 80° C. by means of an E type viscometer in accordance with the foregoing methods. These resin compositions for semiconductor encapsulation were each then measured and evaluated for glass transition temperature (Tg), storage stability (degree of sedimentation of inorganic filler, degree of change of viscosity), dischargeability, coatability and pot life in accordance with the following methods. The semiconductor devices produced using the foregoing resin compositions for semiconductor encapsulation were then measured and evaluated for reliability in humidity resistance in accordance with the following method. The results are set forth in Tables 25 to 27 below.

[Glass Transition Temperature (Tg)]
The glass transition temperature was determined in the same manner as in the first embodiment.

[Storage Stability]
*1: Degree of Sedimentation of Inorganic Filler
The degree of sedimentation of inorganic filler was determined in the same manner as in the first embodiment.

*2: Degree of Viscosity Change
The degree of viscosity change was determined in the same manner as in the first embodiment.

[Dischargeability, Coatability]
The dischargeability and coatability were determined in the same manner as in the first embodiment.

[Pot Life (Viscosity Change)]
The pot life was determined in the same manner as in the first embodiment.

[Reliability in Humidity Resistance]
The reliability in humidity resistance was determined in the same manner as in the first embodiment.

TABLE 25

| | Example No. | | | | |
|---|---|---|---|---|---|
| | c1 | c2 | c3 | c4 | c5 |
| Properties at 25° C. | Solid | Solid | Solid | Solid | Semi-solid |
| Viscosity 25° C. | Solid | Solid | Solid | Solid | 255000 |
| (poise) 80° C. | 22.5 | 24 | 4500 | 3000 | 82.5 |
| Glass transition temp. (° C.) | 126 | 124 | 125 | 125 | 133 |
| Storage *1 stability *2 | ◎ ◎ | ◎ ○ | ◎ ◎ | ◎ ◎ | ◎ ◎ |
| Dischargeability, coatability | ◎ | ◎ | Δ | ○ | ◎ |
| Pot life | ◎ | ○ | ◎ | ◎ | ◎ |
| Reliability in humidity resistance (PCT) | 200< | 200< | 170 | 150 | 200< |

*1: Degree of sedimentation of inorganic filler
*2: Degree of viscosity change

TABLE 26

| | Example No. | | | | |
|---|---|---|---|---|---|
| | c6 | c7 | c8 | c9 | c10 |
| Properties at 25° C. | Semi-solid | Solid | Solid | Solid | Semi-solid |
| Viscosity 25° C. | 50000 | Solid | Solid | Solid | 7200 |
| (poise) 80° C. | 90 | 610 | 22.5 | 23 | 60 |
| Glass transition temp. (° C.) | 134 | 136 | 88 | 85 | 94 |
| Storage *1 stability *2 | ◎ ◎ | ◎ ◎ | ◎ ◎ | ◎ ○ | ◎ ◎ |
| Dischargeability, coatability | ◎ | ○ | ◎ | ◎ | ◎ |
| Pot life | ◎ | ◎ | ◎ | ○ | ◎ |
| Reliability in humidity resistance (PCT) | 200< | 200< | 100 | 100 | 180 |

*1: Degree of sedimentation of inorganic filler
*2: Degree of viscosity change

TABLE 27

| | Example No. | Comparative Example No. | | | |
|---|---|---|---|---|---|
| | C11 | c1 | c2 | c3 | c4 |
| Properties at 25° C. | Semi-solid | Liquid | Liquid | Solid | Solid |
| Viscosity 25° C. | 50000 | 5700 | 6100 | Solid | Solid |
| (poise) 80° C. | 36 | 15 | 55 | 5560 | 1500 |
| Glass transition temp. (° C.) | 118 | 59 | 93 | 124 | 145 |

TABLE 27-continued

| | | Example No. | Comparative Example No. | | |
|---|---|---|---|---|---|
| | | C11 | c1 | c2 | c3 | c4 |
| Storage | *1 | ◉ | X | X | ◉ | ◉ |
| stability | *2 | ◉ | ◉ | ◉ | ◉ | X |
| Dischargeability, coatability | | ◉ | ◉ | ◉ | X | Δ |
| Pot life | | ◉ | ◉ | ◉ | ◉ | X |
| Reliability in humidity resistance (PCT) | | 200 | 70 | 90 | 170 | 80 |

*1: Degree of sedimentation of inorganic filler
*2: Degree of viscosity change

As can be seen in the results of Table 25 to 27 above, all the products of the present examples show no sedimentation of inorganic filler and exhibit a prolonged pot life and excellent storage stability. The resin compositions for semiconductor encapsulation of the present examples exhibit an excellent dischargeability and coatability. The semiconductor devices produced using the resin compositions for semiconductor encapsulation of the present examples exhibit a good reliability in humidity resistance. In particular, the products of Examples c1 to c7 comprise a polyfunctional solid phenolic resin as a solid phenolic resin and thus exhibit a higher glass transition temperature than those comprising a solid resin which is not a polyfunctional solid resin. Further, the products of Examples c1, c3 to c8, c10 and c11 comprise a specific microcapsule type curing accelerator as a latent curing accelerator and thus exhibit an extremely prolonged pot life and hence is excellent in storage stability as compared with those comprising a commercially available microcapsule type curing accelerator.

On the contrary, the product of Comparative Example c1 comprises a liquid epoxy resin and a liquid phenolic resin and thus exhibits a deteriorated storage stability that causes the sedimentation of inorganic filler. Further, the product of Comparative Example c2 exhibits a viscosity of less than 7,000 poise at a temperature of 25° C. and thus exhibits a deteriorated storage stability that causes the sedimentation of inorganic filler. Moreover, the product of Comparative Example c3 exhibits a viscosity of more than 5,000 poise that deteriorates the dischargeability and coatability thereof. The product of Comparative Example c4 comprises a curing accelerator which is not a latent curing accelerator and thus exhibits a reduced pot life and hence a deteriorated storage stability.

The present invention will be further described in the following examples of process for the production of the foregoing semiconductor devices.

EXAMPLE c12

The resin composition for semiconductor encapsulation prepared in Example c1 was previously defoamed at a temperature of 70° C. in vacuo. The resin composition thus defoamed was then used to produce a semiconductor-device. In some detail, a wiring circuit board having semiconductor elements mounted thereon wherein the two components are electrically connected to each other with a bonding wire was prepared. The resin composition for semiconductor encapsulation which had been heated to a temperature of 70° C. was then applied to the wiring circuit board and semiconductor elements which had previously been heated to a temperature of 70° C. at a pressure of 5 Torr by printing through an opening in the mask. Subsequently, the pressure of the atmosphere was raised to 150 Torr to remove voids contained in the resin composition for semiconductor encapsulation thus applied. The resin composition for semiconductor encapsulation which had been heated to a temperature of 70° C. was then used to finish printing with the pressure of the atmosphere being kept to 150 Torr. Thereafter, the resin composition for semiconductor encapsulation thus applied was thermoset at a temperature of 150° C. for 3 hours to form an encapsulating resin layer in such an arrangement that the semiconductor elements are encapsulated. In this manner, a cavity fill type of semiconductor device was produced.

EXAMPLE c13

The resin composition for semiconductor encapsulation prepared in Example c4 was previously defoamed at a temperature of 70° C. in vacuo. The resin composition thus defoamed was then used to produce a semiconductor device. In some detail, the resin composition for semiconductor encapsulation which had been heated to a temperature of 70° C. was applied to a wiring circuit board which had previously been heated to a temperature of 100° C. through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c14

A semiconductor device was produced by flip chip mounting in the same manner as in Example c12 except that the resin composition for semiconductor encapsulation of Example c6 which had been previously defoamed at a temperature of 70° C. in vacuo was used.

EXAMPLE c15

A semiconductor device was produced by flip chip mounting in the same manner as in Example c12 except that the resin composition for semiconductor encapsulation of Example c7 which had been previously defoamed at a temperature of 70° C. in vacuo was used.

EXAMPLE c16 (Comprising Epoxy Resin and Phenolic Resin in Combination)

The resin composition for semiconductor encapsulation prepared in Example c1 was previously defoamed at a temperature of 70° C. in vacuo. The resin composition thus defoamed was then used to produce a semiconductor device. In some detail, a wiring circuit board having semiconductor elements mounted thereon wherein the two components are electrically connected to each other with a bonding wire was prepared. The resin composition for semiconductor encapsulation which had been heated to a temperature of 70° C. was then applied to the wiring circuit board and semiconductor elements which had previously been heated to a temperature of 70° C. at a pressure of 5 Torr by printing through an opening in the mask. Subsequently, the pressure of the atmosphere was raised to 150 Torr to remove voids contained in the resin composition for semiconductor encapsulation thus applied. The resin composition for semiconductor encapsulation which had been heated to a temperature of 70° C. was then used to finish printing with the pressure of the atmosphere being kept to 150 Torr. Thereafter, the resin composition for semiconductor encapsulation thus applied was thermoset at a temperature of 150° C. for 3 hours to form an encapsulating resin layer in such an arrangement that the semiconductor elements are encapsulated. In this manner, a cavity fill type of semiconductor device was produced.

[Preparation of Resin Composition for Semiconductor Encapsulation α3]

The various components were mixed in proportions set forth in Table 28 below, melt-kneaded in a universal agitator, and then defoamed at a temperature of 70° C. in vacuo. The mixture was then cooled to room temperature to prepare a desired resin composition for semiconductor encapsulation. The kneading conditions were as follows. In some detail, the epoxy resin and the phenolic resin were charged into the universal agitator where they were then stirred at a temperature of 150° C. for 10 minutes so that all the solid content was dissolved. Subsequently, the temperature in the universal agitator was lowered to a range of from 90° C. to 100° C., and the mixture was then mixed with the inorganic filler for 10 minutes. Subsequently, the temperature in the universal agitator was adjusted to 75° C., and the mixture was then mixed with the curing accelerator for 2 minutes for use.

The resin composition for semiconductor encapsulation α3 thus obtained was then measured for viscosity at 25° C. and 80° C. by means of an E type viscometer in accordance with the methods previously mentioned. The resin composition for semiconductor encapsulation α3 was then measured and evaluated for glass transition temperature (Tg), storage stability (degree of sedimentation of inorganic filler, degree of change of viscosity) dischargeability, coatability and pot life in accordance with the methods previously mentioned. The semiconductor device produced using the foregoing resin composition for semiconductor encapsulation α3 was then measured and evaluated for reliability in humidity resistance in accordance with the method previously mentioned. The results are set forth in Table 28 below.

TABLE 28

| | | Resin composition for semiconductor encapsulation α3 |
|---|---|---|
| Epoxy resin | ac1 | 391 |
| Phenolic resin | bc2 | 99.7 |
| | bc3 | 99.7 |
| Curing accelerator | c1 | 23.1 |
| Inorganic filler | d3 | 886 |
| Content of inorganic filler in total amount (wt %) | | 59 |
| Properties at 25° C. | | Solid |
| Viscosity (poise) | 25° C. | Solid |
| | 80° C. | 25 |
| Glass transition temperature (° C.) | | 125 |
| Storage stability | *1 | ◎ |
| | *2 | ◎ |
| Dischargeability and coatability | | ◎ |
| Pot life | | ◎ |
| Reliability in humidity resistance (PCT) | | 200< |

*1: Degree of sedimentation of inorganic filler
*2: Degree of viscosity change

EXAMPLE c17

A semiconductor device was produced using the resin composition for semiconductor encapsulation α3 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 100° C. was filled with the resin composition for semiconductor encapsulation α3 which had been previously heated to a temperature of 70° C. through a dispenser. Thereafter, the resin composition for semiconductor encapsulation α3 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE c18

A semiconductor device was produced using the resin composition for semiconductor encapsulation α3 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α3 which had been previously heated to a temperature of 70° C. at a pressure of 5 Torr through a dispenser. Thereafter, the resin composition for semiconductor encapsulation α3 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE c19

A semiconductor device was produced using the resin composition for semiconductor encapsulation α3 as follows. In some detail, a wiring circuit board having semiconductor elements mounted thereon with connecting electrode portions interposed therebetween was prepared. Subsequently, the gap between the wiring circuit board and semiconductor elements which had been previously heated to a temperature of 70° C. was filled with the resin composition for semiconductor encapsulation α3 which had been previously heated at a pressure of 5 Torr to a temperature of 70° C. through a dispenser. Thereafter, the pressure was returned to atmospheric pressure. The gap between the wiring circuit board and the semiconductor elements was then filled with the resin composition for semiconductor encapsulation α3 which had been heated to a temperature of 70° C. (differential pressure filling). The resin composition for semiconductor encapsulation α3 thus applied was thermoset at a temperature of 150° C. for 3 hours to form an encapsulating resin layer in the gap between the wiring circuit board and the semiconductor elements. In this manner, a semiconductor device was produced by flip chip mounting.

EXAMPLE c20

A semiconductor device was produced using the resin composition for semiconductor encapsulation α3 as follows. In some detail, the resin composition for semiconductor encapsulation α3 which had been heated to a temperature of 70° C. was applied to a wiring circuit board which had previously been heated to a temperature of 100° C. through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c21

A semiconductor device was produced using the resin composition for semiconductor encapsulation α3 as follows. In some detail, the resin composition for semiconductor encapsulation α3 which had been heated to a temperature of 70° C. was applied to semiconductor elements which had previously been heated to a temperature of 100° C. through a dispenser so that the semiconductor elements were potted. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c22

A semiconductor device was produced using the resin composition for semiconductor encapsulation α3 as follows. In some detail, the resin composition for semiconductor encapsulation α3 which had been heated to a temperature of 70° C. was applied to a wiring circuit board which had previously been heated to a temperature of 70° C. at a pressure of 5 Torr through a dispenser so that the wiring circuit board was potted. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c23

A semiconductor device was produced using the resin composition for semiconductor encapsulation α3 as follows. In some detail, the resin composition for semiconductor encapsulation α3 which had been heated to a temperature of 70° C. was applied to semiconductor elements which had been previously heated to a temperature of 70° C. at a pressure of 5 Torr through a dispenser so that the semiconductor elements were potted. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c24

A semiconductor device was produced using the resin composition for semiconductor encapsulation α3 as follows. In some detail, the resin composition for semiconductor encapsulation α3 which had been heated to a temperature of 70° C. was applied to semiconductor elements which had previously been heated to a temperature of 70° C. by printing through an opening in the mask. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c25

A semiconductor device was produced using the resin composition for semiconductor encapsulation α3 as follows. In some detail, the resin composition for semiconductor encapsulation α3 which had been heated to a temperature of 70° C. was applied to a wiring circuit board which had previously been heated to a temperature of 70° C. by printing through an opening in the mask. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+ 220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c26

A semiconductor device was produced using the resin composition for semiconductor encapsulation α3 as follows. In some detail, the resin composition for semiconductor encapsulation α3 which had been heated to a temperature of 70° C. was applied to semiconductor elements which had previously been heated to a temperature of 70° C. by printing through an opening in the mask at a pressure of 5 Torr. Thereafter, using a flip chip bonder, a wiring circuit board which had been heated to a temperature of 70° C. was placed on the semiconductor elements, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c27

A semiconductor device was produced using the resin composition for semiconductor encapsulation α3 as follows. In some detail, the resin composition for semiconductor encapsulation α3 which had been heated to a temperature of 70° C. was applied to a wiring circuit board which had previously been heated to a temperature of 70° C. by printing through an opening in the mask at a pressure of 5 Torr. Thereafter, using a flip chip bonder, semiconductor elements were placed on the wiring circuit board, the semiconductor elements and the wiring circuit board were then electrically connected to each other with connecting electrode portions under hot pressing conditions (150° C.×2 kg×20 min.+220° C.×0.5 kg×2 min.), and at the same time, an encapsulating resin layer was formed in the gap between the wiring circuit board and the semiconductor elements. In this manner, a semiconductor was produced by flip chip mounting.

EXAMPLE c28

A semiconductor device was produced using the resin composition for semiconductor encapsulation α3 as follows. In some detail, a wiring circuit board having semiconductor elements mounted thereon wherein they are electrically connected to each other with a bonding wire was prepared. The resin composition for semiconductor encapsulation α3 which had been heated to a temperature of 70° C. was then applied to the semiconductor elements which had been previously heated to a temperature of 100° C. through a dispenser so that the semiconductor elements were potted. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE c29

A semiconductor device was produced using the resin composition for semiconductor encapsulation α3 as follows. In some detail, a wiring circuit board having semiconductor elements mounted thereon wherein they are electrically connected to each other with a bonding wire was prepared. The resin composition for semiconductor encapsulation α3 which had been heated to a temperature of 70° C. was then applied to the semiconductor elements which had been previously heated to a temperature of 70° C. through a dispenser at a pressure of 5 Torr so that the semiconductor elements were-potted. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE c30

A semiconductor device was produced using the resin composition for semiconductor encapsulation α3 as follows. In some detail, a wiring circuit board having semiconductor elements mounted thereon wherein they are electrically connected to each other with a bonding wire was prepared. The resin composition for semiconductor encapsulation α3 which had been heated to a temperature of 70° C. was then applied to the semiconductor elements which had been previously heated to a temperature of 70° C. by printing through an opening in the mask. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE c31

A semiconductor device was produced using the resin composition for semiconductor encapsulation α3 as follows. In some detail, a wiring circuit board having semiconductor elements mounted thereon wherein they are electrically connected to each other with a bonding wire was prepared. The resin composition for semiconductor encapsulation α3 which had been heated to a temperature of 70° C. was then applied to the semiconductor elements which had been previously heated to a temperature of 70° C. by printing through an opening in the mask at a pressure of 5 Torr. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE c32

A semiconductor device was produced using the resin composition for semiconductor encapsulation α3 as follows. In some detail, a wiring circuit board having semiconductor elements mounted thereon wherein they are electrically connected to each other with a bonding wire was prepared. The resin composition for semiconductor encapsulation α3 which had been heated to a temperature of 70° C. was then applied to the semiconductor elements which had been previously heated to a temperature of 70° C. by printing through an opening in the mask at a pressure of 5 Torr. Subsequently, the pressure of the atmosphere was raised to 150 Torr to remove voids contained in the resin composition for semiconductor encapsulation α3 thus applied. The resin composition for semiconductor encapsulation α3 which had been heated to a temperature of 70° C. was then used to finish printing with the pressure of the atmosphere being kept to 150 Torr. Thereafter, the resin composition thus applied was thermoset at a temperature of 150° C. for 3 hours to form an encapsulating resin layer in such an arrangement that the semiconductor elements were encapsulated. In this manner, a cavity fill type of semiconductor device was produced.

EXAMPLE c33

The semiconductor device produced in Example c20 was placed on a mounting board (mother board), electrically connected to the mounting board, and then heated to a temperature of 100° C. The gap between the mounting board and the semiconductor device was then filled with the resin composition for semiconductor encapsulation α3 which had been heated to a temperature of 70° C. through a dispenser. The resin composition thus applied was then thermoset at a temperature of 150° C. for 3 hours to form an encapsulating resin layer in the gap between the semiconductor device and the mounting board. In this manner, a semiconductor product was produced.

The various semiconductor devices and semiconductor products thus obtained were each visually examined for presence of bubbles in the encapsulating resin layer. The results are set forth in Tables 29 to 31.

TABLE 29

| | Example No. | | | | | | | | |
|---|---|---|---|---|---|---|---|---|---|
| | c12 | c13 | c14 | c15 | c16 | c17 | c18 | c19 | c20 |
| Presence of bubbles | Small amount | Small amount | Small amount | Small amount | Small amount | None | None | Small amount | Small amount |

TABLE 30

| | Example No. | | | | | | | | |
|---|---|---|---|---|---|---|---|---|---|
| | c21 | c22 | c23 | c24 | c25 | c26 | c27 | c28 | c29 |
| Presence of bubbles | None | None | Small amount | Small amount | None | None | Yes | Small amount | Yes |

TABLE 31

| | Example No. | | | |
|---|---|---|---|---|
| | c30 | c31 | c32 | c33 |
| Presence of bubbles | Small amount | None | Small amount | Small amount |

As can be seen in the results of Tables 29 to 31, all the semiconductor devices or semiconductor product except those of Examples c27 and c29 were observed to have no or a small amount of bubbles present in the encapsulating resin layer. (4) Examples of the process for the production of a semiconductor device comprising the resin composition for semiconductor encapsulation of the invention provided on a semiconductor wafer and a matrix wiring circuit board will be described hereinafter.

EXAMPLE d1

The resin composition for semiconductor encapsulation prepared in Example a1 was previously defoamed at a temperature of 70° C. in vacuo. A semiconductor device (wafer level CSP) was then produced from the resin composition thus defoamed as follows. In some detail, the resin composition for semiconductor encapsulation was applied to the protruding electrode portion side of a semiconductor wafer having a plurality of semiconductor elements with protruding electrode portion formed thereon which had been previously heated to a temperature of 70° C. through a dispenser to a thickness of 150 μm to form a resin layer. The resin composition thus applied was defoamed at a pressure of 5 Torr, and then thermoset at a temperature of 150° C. for 3 hours to form an encapsulating resin layer. Thereafter, the resin portion was polished in such a manner that the forward end of the protruding electrode portion was exposed to the exterior of the resin layer. The semiconductor wafer was then cut into pieces by a dicer to produce semiconductor devices (wafer level SCP).

EXAMPLE d2

The resin composition for semiconductor encapsulation prepared in Example a1 was previously defoamed at a temperature of 70° C. in vacuo. A semiconductor device (wafer level CSP) was then produced from the resin composition thus defoamed as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask at a pressure of 5 Torr to a thickness of 150 μm. The resin composition thus applied was then thermoset at a temperature of 150° C. for 3 hours to form an encapsulating resin layer. Thereafter, the resin portion was polished in such a manner that the forward end of the protruding electrode portion was exposed to the exterior of the resin layer. The semiconductor wafer was then cut into pieces by a dicer to produce semiconductor devices (wafer level SCP).

EXAMPLE d3

The resin composition for semiconductor encapsulation prepared in Example a1 was previously defoamed at a temperature of 70° C. in vacuo. A semiconductor device (wafer level CSP) was then produced from the resin composition thus defoamed as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask at a pressure of 5 Torr to a thickness of 150 μm. Thereafter, the pressure of the atmosphere was returned to 150 Torr where the resin composition was defoamed. Subsequently, the semiconductor wafer was subjected to finish printing at a pressure of 150 Torr. Thereafter, the resin composition thus applied was then thermoset at a temperature of 150° C. for 3 hours to form an encapsulating resin layer. Thereafter, the resin portion was polished in such a manner that the forward end of the protruding electrode portion was exposed to the exterior of the resin layer. The semiconductor wafer was then cut into pieces by a dicer to produce semiconductor devices (wafer level SCP).

EXAMPLE d4

A plurality of semiconductor elements were mounted on a matrix wiring circuit board having individual wiring circuits formed thereon with bonding wires. A semiconductor device (MAP-BGA process) was then produced from the resin composition for semiconductor encapsulation of Example a1 which had been defoamed at a temperature of 70° C. as follows. In some detail, the resin composition for semiconductor encapsulation was applied to the entire surface of semiconductor elements mounted on the matrix wiring circuit board which had been previously heated to a temperature of 70° C. through a dispenser to form a resin in such an arrangement that the semiconductor elements were encapsulated. The resin layer thus formed was then defoamed at a pressure of 5 Torr. The resin composition thus applied was then thermoset at a temperature of 150° C. for 3 hours to form an encapsulating resin layer. The matrix wiring circuit board was then cut into pieces by a dicer to produce semiconductor devices (MAP-BGA process).

EXAMPLE d5

A plurality of semiconductor elements were mounted directly on a matrix wiring circuit board having individual wiring circuits formed thereon. A semiconductor device (MAP-BGA process) was then produced from the resin composition for semiconductor encapsulation of Example a1 which had been defoamed at a temperature of 70° C. as follows. In some detail, the resin composition for semiconductor encapsulation was applied to the entire surface of semiconductor elements mounted on the matrix wiring circuit board which had been previously heated to a temperature of 70° C. by printing through an opening in the mask at a pressure of 5 Torr. The resin composition thus applied was then thermoset at a temperature of 150° C. for 3 hours to form an encapsulating resin layer. The matrix wiring circuit board was then cut into pieces by a dicer to produce semiconductor devices (MAP-BGA process).

EXAMPLE d6

A plurality of semiconductor elements were mounted directly on a matrix wiring circuit board having individual wiring circuits formed thereon. A semiconductor device (MAP-BGA process) was then produced from the resin composition for semiconductor encapsulation of Example a1 which had been defoamed at a temperature of 70° C. as follows. In some detail, the resin composition for semiconductor encapsulation was applied to the entire surface of semiconductor elements mounted on the matrix wiring circuit board which had been previously heated to a temperature of 70° C. by printing through an opening in the mask at a pressure of 5 Torr. Thereafter, the pressure of the atmosphere was returned to 150 Torr where the resin composition thus applied was defoamed. Subsequently, the semiconductor wafer was subjected to finish printing at a pressure of 150 Torr. The resin composition thus applied was then thermoset at a temperature of 150° C. for 3 hours to form an encapsulating resin layer. The matrix wiring circuit board was then cut into pieces by a dicer to produce semiconductor devices (MAP-BGA process).

EXAMPLE d7

The resin composition for semiconductor encapsulation prepared in Example a1 was previously defoamed at a temperature of 70° C. in vacuo. A semiconductor device was then produced using the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. through a dispenser to a thickness of 50 µm to form a resin layer. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 150° C.×2 kg×20 min+220° C.×0.5 kg×2 min) with the wiring circuit board and the resin layer side of the semiconductor elements being opposed to each other. In this manner, the semiconductor elements and the wiring circuit board were electrically connected to each other with the protruding electrode portion, and at the same time, an encapsulating resin layer was formed in the gap between the wiring-circuit board and the semiconductor elements. As a result, a semiconductor device was produced by flip chip mounting.

EXAMPLE d8

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask to a thickness of 50 µm. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 150° C.×2 kg×20 min+220° C.×0.5 kg×2 min) with the wiring circuit board and the resin layer side of the semiconductor elements being opposed to each other. In this manner, the semiconductor elements and the wiring circuit board were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE d9

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask to a thickness of 50 µm. The resin composition thus applied was then defoamed at a pressure of 5 Torr. Thereafter, the semi conductor wafer was cut into pieces by a dicer. Subsequently, using a flip chip bonder, a wiring circuit board which had been previously heated to a temperature of 70° C. and the semiconductor elements thus separated were hot-pressed (conditions: 150° C.×2 kg×20 min+220° C.×0.5 kg×2 min) with the wiring circuit board and the resin layer side of the semiconductor elements being opposed to each other. In this manner, the semiconductor elements and the wiring circuit board were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE d10

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing at a pressure of 5 Torr through an opening in the mask to a thickness of 50 µm. Thereafter, the pressure of the atmosphere was returned to 150 Torr where the resin composition thus applied was then defoamed. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 150° C.×2 kg×20 min+220° C.×0.5 kg×2 min) with the wiring circuit board and the resin layer side of the semiconductor elements being opposed to each other. In this manner, the semiconductor elements and the wiring circuit board were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE d11

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. through a dispenser at a pressure of 5 Torr to form a resin layer. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 150° C.×2 kg×20 min+220° C.×0.5 kg×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode-portion, and at the same time, an encapsulating resin layer was formed in the gap between the wiring circuit board and the semiconductor elements. As a result, a semiconductor device was produced by flip chip mounting.

EXAMPLE d12

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. by printing through an opening in the mask to form a resin layer. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 150° C.×2 kg×20 min+220° C.×0.5 kg×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE d13

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. by printing through an opening in the mask to form a resin layer. The resin layer thus formed was then defoamed at a pressure of 5 Torr. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 150° C.×2 kg×20 min+220° C.×0.5 kg×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE d14

The resin composition for semiconductor encapsulation prepared in Example a1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. by printing through an opening in the mask at a pressure of 5 Torr to form a resin layer. Thereafter, the pressure of the atmosphere was returned to 150 Torr where the resin composition thus applied was defoamed. Subsequently, the matrix wiring circuit board was subjected to finish printing at a pressure of 150 Torr. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 150° C.×2 kg×20 min+220° C.×0.5 kg×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit boards and the semiconductor elements. As a result, a semiconductor device was produced by flip chip mounting.

The various semiconductor devices thus obtained were each then visually observed for the presence of bubbles in the encapsulating resin layer. The results are set forth in Tables 32 and 33 below.

TABLE 3

| | Example No. | | | | | | | | |
|---|---|---|---|---|---|---|---|---|---|
| | d1 | d2 | D3 | d4 | d5 | d6 | d7 | d8 | d9 |
| Presence of bubbles | Small amount | Small amount | None | None | None | None | Small amount | Small amount | None |

TABLE 33

| | Example No. | | | | |
|---|---|---|---|---|---|
| | d10 | d11 | d12 | d13 | d14 |
| Presence of bubbles | None | None | Small amount | None | None |

As can be seen in the results of Tables 32 and 33 above, all the semiconductor devices thus obtained were observed to have no or a small amount of bubbles present in the encapsulating resin layer.

INDUSTRIAL APPLICABILITY

As mentioned above, the present invention provides a resin composition for semiconductor encapsulation comprising an epoxy resin (component A), a phenolic resin (component B), a latent curing accelerator (component C) and an inorganic filler (component D) and having a viscosity at 25° C. and 80° C. falling within a predetermined range. Thus, the resin composition for semiconductor encapsulation according to the invention exhibits a prolonged pot life and an excellent storage stability as compared with the conventional liquid encapsulating medium. Further, the resin composition for semiconductor encapsulation according to the invention, even if it stays solid or semi-solid at room temperature, shows a rapid viscosity drop and thus can be liquefied at a temperature of as low as from 40° C. to 80° C., showing an excellent dischargeability and coatability. In particular, since the resin composition for semiconductor encapsulation according to the invention stays solid or semi-solid at ordinary temperatures, it can be freely handled at ordinary temperatures even if it is not cured after applied to semiconductor elements or wiring circuit boards. Accordingly, a semiconductor wafer, matrix wiring circuit board or the like to which the resin composition for semiconductor encapsulation according to the invention has been applied can be cut into individual elements and wiring circuit boards which are then connected to each other by hot pressing method or the like using a flip chip bonder or the like. Further, since the resin composition for semiconductor encapsulation according to the invention can be stored solid or semi-solid at room temperature, the inorganic filler (component D) cannot be sedimented. Accordingly, the resin composition for semiconductor encapsulation according to the invention can be stored solid or semi-solid and then liquefied at low temperatures as necessary before use, making it possible to fairly encapsulate semiconductor elements. As a result, a semiconductor device having a high reliability particularly in humidity resistance can be obtained.

The resin composition for semiconductor encapsulation according to the invention is also advantageous in that it exhibits an extremely prolonged pot life and thus is excellent particularly in storage stability when it comprises as the latent curing accelerator (component C) a microcapsule type curing accelerator having a core-shell structure in which a core portion made of a curing accelerator is covered by a specific shell portion.

The resin composition for semiconductor encapsulation according to the invention is further advantageous in that it exhibits an excellent fluidity and thus is excellent particularly in dischargeability and coatability when it comprises as the inorganic filler (component D) a spherical fused silica powder incorporated therein in a predetermined proportion based thereon.

The invention claimed is:

1. A resin composition for semiconductor encapsulation comprising the following components (A) to (D) and having a viscosity of 7,000 poise or more at 25° C. and 5,000 poise or less at 80° C.:

(A) an epoxy resin;
(B) a phenolic resin;
(C) a latent curing accelerator, wherein the latent curing accelerator is a micro-capsule curing accelerator having a core-shell structure comprising a core portion made of the curing accelerator encapsulated with a shell portion mainly composed of a polymer having a structural unit represented by the following general formula (1)

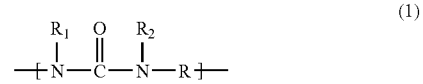

wherein R represents a divalent or trivalent organic group, and $R_1$ and $R_2$, which may be the same or different, each represents a hydrogen atom or a monovalent organic group; and (D) an inorganic filler.

2. The resin composition for semiconductor encapsulation according to claim 1, wherein said component (A) is a liquid epoxy resin and said component (B) is a solid phenolic resin.

3. The resin composition for semiconductor encapsulation according to claim 1, wherein said component (A) is a solid epoxy resin and said component (B) is a liquid phenolic resin.

4. The resin composition for semiconductor encapsulation according to claim 1, wherein said component (A) is a solid epoxy resin and said component (B) is a solid phenolic resin.

5. The resin composition for semiconductor encapsulation according to claim 1, wherein said inorganic filler as the component (D) is spherical fused silica powder and said spherical fused silica powder is incorporated in the resin composition for semiconductor encapsulation in a proportion of from 15 to 85% by weight based on the total amount of the resin composition for semiconductor encapsulation.

6. A semiconductor device comprising a semiconductor element provided on a wiring circuit board with a plurality of connecting electrode portions interposed therebetween, the gap between said wiring circuit board and said semiconductor element being sealed with an encapsulating resin layer, wherein said encapsulating resin layer is formed by a resin composition for semiconductor encapsulation according to claim 1.

7. A process for the production of a semiconductor device comprising a semiconductor element provided on a wiring circuit board with a plurality of connecting electrode portions interposed therebetween, the gap between said wiring circuit board and said semiconductor element being sealed with an encapsulating resin layer, which comprises filling the gap between said wiring circuit board and said semiconductor element with a resin composition for semiconductor encapsulation according to claim 1, and then curing the resin composition to form said encapsulating resin layer.

8. A semiconductor device comprising a semiconductor element provided on a wiring circuit board, said wiring circuit board and said semiconductor element being electrically connected to each other, said semiconductor element being encapsulated by an encapsulating resin layer in such an arrangement that said semiconductor element is incorporated therein, wherein said encapsulating resin layer is formed by a resin composition for semiconductor encapsulation according to claim 1.

9. A process for the production of a semiconductor device comprising a semiconductor element provided on a wiring circuit board, said wiring circuit board and said semiconductor element being electrically connected to each other, said semiconductor element being encapsulated by an encapsulating resin layer in such an arrangement that said semiconductor element is incorporated therein, which comprises placing a semiconductor element on said wiring circuit board, electrically connecting said wiring circuit board and said semiconductor element to each other, supplying a resin composition for semiconductor encapsulation according to claim 1 onto the semiconductor element side of said wiring circuit board, and then curing said resin composition for semiconductor encapsulation to form said encapsulating resin layer.

10. A semiconductor product comprising a semiconductor device having a resin encapsulation layer formed with a plurality of connecting electrode portions interposed therebetween, said semiconductor device being provided on a mounting board with the wiring circuit board of the semiconductor device being opposed to said mounting board, and the gap between said mounting board and said semiconductor device being sealed with an encapsulating resin layer, wherein said encapsulating resin layer is formed by a resin composition for semiconductor encapsulation according to claim 1.

11. A process for the production of a semiconductor device, which comprises a step of forming a resin layer made of a resin composition for semiconductor encapsulation according to claim 1 on the protruding electrode portion side of a semiconductor wafer having a plurality of semiconductor elements having protruding electrode portions formed thereon to a predetermined thickness in such an arrangement that at least the forward ends of said protruding electrode portions are exposed to the exterior of said resin layer, and a step of cutting said semiconductor wafer having a resin layer formed thereon to individual semiconductor elements.

12. The process for the production of a semiconductor device according to claim 11, wherein said step of forming a resin layer is carried out by printing through an opening in a mask.

13. A process for the production of a semiconductor device, which comprises a step of supplying a resin composition for semiconductor encapsulation according to claim 1 onto the whole of a plurality of semiconductor elements provided on a matrix wiring circuit board having individual circuits formed thereon to form a resin layer with said semiconductor elements being incorporated therein, and a step of cutting said matrix wiring circuit board having a resin layer formed thereon with said semiconductor elements being incorporated therein together with said resin layer to every semiconductor element.

14. The process for the production of a semiconductor device according to claim 13, wherein said step of forming a resin layer is carried out by printing through an opening in a mask.

15. A process for the production of a semiconductor device, which comprises a step of forming a resin layer made of a resin composition for semiconductor encapsulation according to claim 1 on the protruding electrode portion side of a semiconductor wafer having a plurality of semiconductor elements having protruding electrode portions formed thereon to a predetermined thickness, a step of cutting said semiconductor wafer having a resin layer formed thereon to individual semiconductor elements, and a step of contact-bonding a wiring circuit board and said semiconductor element thus cut under heating with the resin layer side of said semiconductor element and said wiring circuit board being opposed to each other such that the two components are electrically connected to each other and said resin layer is melted and cured to form an encapsulating resin layer between said semiconductor element and said wiring circuit board, thereby encapsulating said semiconductor element.

16. The process for the production of a semiconductor device according to claim 15, wherein said step of forming a resin layer made of said resin composition for semiconductor encapsulation is carried out by printing through an opening in a mask.

17. The process for the production of a semiconductor device according to claim 15, wherein said step of forming a resin layer made of said resin composition for semiconductor encapsulation is carried out by means of a dispenser.

18. A process for the production of a semiconductor device, which comprises a step of applying a resin composition for semiconductor encapsulation according to claim 1 to a matrix wiring circuit board having individual circuits formed thereon to form a resin layer thereon, a step of cutting said wiring circuit board having a resin layer formed thereon to individual wiring circuit boards, and a step of contact-bonding semiconductor elements each having a plurality of connecting electrode portions provided thereon and said wiring circuit boards thus cut under heating with the connecting electrode portion side of said semiconductor elements and said wiring circuit boards being opposed to each other such that the two components are electrically connected to each other and said resin layer is melted and cured to form an encapsulating resin layer between said semiconductor elements and said wiring circuit boards, thereby encapsulating said semiconductor element.

19. The process for the production of a semiconductor device according to claim 18, wherein said step of applying a resin composition for semiconductor encapsulation to form a resin layer is carried out by printing through an opening in a mask.

20. The process for the production of a semiconductor device according to claim 18, wherein said step of applying a resin composition for semiconductor encapsulation to form a resin layer is carried out by means of a dispenser.

21. The resin composition for semiconductor encapsulation according to claim 1, wherein said polymer having a structural unit represented by formula (1) is obtained by the reaction of a polyisocyanate with a polyvalent amine.

\* \* \* \* \*